United States Patent
Lee

(10) Patent No.: US 11,435,379 B2
(45) Date of Patent: Sep. 6, 2022

(54) DEVICE AND METHOD FOR DETECTING HIGH-VOLTAGE POWER DISTRIBUTION LINE PATH HAVING IMPROVED STABILITY

(71) Applicant: Hyun Chang Lee, Gyeonggi-do (KR)

(72) Inventor: Hyun Chang Lee, Gyeonggi-do (KR)

(*) Notice: Subject to any disclaimer, the term of this patent is extended or adjusted under 35 U.S.C. 154(b) by 136 days.

(21) Appl. No.: 17/041,296

(22) PCT Filed: Mar. 26, 2019

(86) PCT No.: PCT/KR2019/003507
§ 371 (c)(1),
(2) Date: Sep. 24, 2020

(87) PCT Pub. No.: WO2019/190170
PCT Pub. Date: Oct. 3, 2019

(65) Prior Publication Data
US 2021/0018540 A1 Jan. 21, 2021

(30) Foreign Application Priority Data

Mar. 26, 2018 (KR) .......... 10-2018-0034180
Nov. 8, 2018 (KR) .......... 10-2018-0136898
Mar. 26, 2019 (KR) .......... 10-2019-0034197

(51) Int. Cl.
*G01R 1/20* (2006.01)
*G01R 15/20* (2006.01)
(Continued)

(52) U.S. Cl.
CPC .......... *G01R 15/20* (2013.01); *G01K 13/00* (2013.01); *G01R 1/203* (2013.01); *G01R 15/16* (2013.01);
(Continued)

(58) Field of Classification Search
CPC ...... G01R 15/20; G01R 31/083; G01R 31/11; G01R 31/085; G01R 19/16528;
(Continued)

(56) References Cited

U.S. PATENT DOCUMENTS

| 5,929,624 A | 7/1999 | Ricq et al. |
| 10,495,679 B2 | 12/2019 | Lee |

(Continued)

FOREIGN PATENT DOCUMENTS

| JP | 2013217839 A | 10/2013 |
| JP | 2016537634 A | 12/2016 |

(Continued)

OTHER PUBLICATIONS

Cable Identifying Generator CI TX Operation manual, Jul. 2009, Issue 4; 67 pages. Retrieved from http://amazonaws.com/productdatasheetsv2/User%20Manual_4644.

*Primary Examiner* — Raul J Rios Russo
(74) *Attorney, Agent, or Firm* — Nicholas Park

(57) ABSTRACT

In an exemplary embodiment of the present disclosure for solving the problem, disclosed is a stability-improved high voltage power line path exploration apparatus. The stability-improved high voltage power line path exploration apparatus for tracking a high voltage power line and determining a buried path and a connection configuration up to a final power source of a power distribution system, wherein the high voltage power line is connected to a primary winding of a distribution transformer to supply voltage and current, wherein the distribution transformer converts high voltage for distribution to low voltage in proportion to a ratio of a winding combination may include: an exploration current generator for generating a current pulse signal in inverse proportion to a winding ratio for detecting a magnetic field signal around the high voltage power line, in which the exploration current generator is connected to a secondary (Continued)

winding of the distribution transformer; a buried path probe for tracking the buried path and connection configuration of the high voltage power line by detecting the magnetic field signal which is generated around the high voltage power line when the current pulse signal flows through the high voltage power line; and a reverse current limiter for suppressing a generation of a reverse magnetic field generated by an external conductor of the high voltage power line, to improve a reception performance of the buried path probe.

8 Claims, 27 Drawing Sheets

(51) Int. Cl.
| | | |
|---|---|---|
| | *G01K 13/00* | (2021.01) |
| | *G01V 3/10* | (2006.01) |
| | *G01R 19/00* | (2006.01) |
| | *G01R 15/16* | (2006.01) |
| | *G01R 15/18* | (2006.01) |
| | *G01R 15/14* | (2006.01) |
| | *G01R 1/22* | (2006.01) |
| | *G01R 15/06* | (2006.01) |

(52) U.S. Cl.
CPC ......... *G01R 15/181* (2013.01); *G01R 15/207* (2013.01); *G01R 19/0092* (2013.01); *G01V 3/10* (2013.01); *G01R 1/22* (2013.01); *G01R 15/06* (2013.01); *G01R 15/142* (2013.01)

(58) Field of Classification Search
CPC .... G01R 19/2513; G01R 27/02; G01R 1/203; G01R 19/0092; G01R 15/16; G01R 15/181; G01R 15/207; G01R 15/142; G01R 1/22; G01R 15/06; G01K 13/00; G01K 1/143; G01V 3/10
USPC ............. 324/72, 76.11–76.83, 115, 126, 149
See application file for complete search history.

(56) References Cited

U.S. PATENT DOCUMENTS

| | | | |
|---|---|---|---|
| 2016/0299183 A1* | 10/2016 | Lee | .......................... G01R 31/08 |
| 2018/0106847 A1* | 4/2018 | Lee | .......................... G01R 31/52 |
| 2018/0113162 A1* | 4/2018 | Lee | .......................... G01R 31/52 |

FOREIGN PATENT DOCUMENTS

| | | |
|---|---|---|
| JP | 2018031718 A | 3/2018 |
| KR | 100396043 B1 | 11/2003 |
| KR | 100752694 B1 | 8/2007 |
| KR | 100778089 B1 | 11/2007 |
| KR | 100947848 B1 | 3/2010 |
| KR | 1020130024991 A | 3/2013 |
| KR | 1020130101790 A | 9/2013 |
| KR | 101559533 B1 | 10/2015 |

* cited by examiner

DEVICE AND METHOD FOR DETECTING HIGH-VOLTAGE POWER DISTRIBUTION LINE PATH HAVING IMPROVED STABILITY

CROSS-REFERENCE TO RELATED APPLICATIONS

This application claims priority to and the benefit of Korean Patent Application No. 10-2018-0034180 filed in the Korean Intellectual Property Office on Mar. 26, 2018, Korean Patent Application No. 10-2018-0136898 filed in the Korean Intellectual Property Office on Nov. 8, 2018, Korean Patent Application No. 10-2019-0034197 filed in the Korean Intellectual Property Office on Mar. 26, 2019, the entire contents of each of which are incorporated herein by reference.

TECHNICAL FIELD

The present disclosure relates to a field of electric power engineering, and more particularly, to an apparatus and a method for exploring a path of a sheathed high voltage power line based on an electromagnetic field signal generated from the high voltage power line in response to a current signal generated at a low-voltage end of a distribution transformer.

BACKGROUND ART

There is a technology to survey a connecting configuration and explore a buried path of low and high-voltage power lines installed in concealed places such as underground power lines that cannot be seen with the naked eyes. Specifically, impulse current signals have been utilized to identify the configuration of a branch line by tracing power lines buried underground or underwater or concealed in customer buildings.

Patent documents for the prior art include Korean Patent No. 10-0396043 "Method and device for detecting and identifying electric cables", Korean Patent No. 10-0752694 "Underground power cable and underground line detection method using the same", and Korea Patent Registration 10-0947848 "Method and apparatus for exploring high-voltage and low-voltage power line paths and connections with a measuring function of the quality of low-voltage power line".

As a non-patent document, there is a CI operator's manual (amazonaws.com/productdatasheetsv2/User%20Manual_4644.pdf) published in 2009 by SEBAKMT, Germany (now MEGGER).

SUMMARY OF THE INVENTION

The present disclosure has been made in an effort to provide a stability-improved high voltage power line exploration apparatus and a method thereof.

An exemplary embodiment of the present disclosure provides a stability-improved high voltage power line path exploration apparatus. The stability-improved high voltage power line exploration apparatus for tracking a high voltage power line that supplies voltage and current by being connected to a primary winding of a distribution transformer that converts high voltage for distribution into low voltage in proportion to the ratio of the winding combinations to determine a buried path and a connection configuration of a distribution system network, the apparatus comprising: an exploration current generator connected to a secondary winding of the distribution transformer and generating a current pulse signal inversely proportional to a winding ratio so as to detect an electromagnetic field signal around the high voltage power line, a buried path probe for determining the buried path and connection configuration of the high voltage power line by detecting the electromagnetic field signal which is generated around the high voltage power line when the current pulse signal flows through the high voltage power line; and a reverse current limiter for suppressing a generation of a reverse electromagnetic field generated by an external conductor of the high voltage power line, to improve a reception performance of the buried path probe.

Alternatively, the exploration current generator comprising: a switching unit for generating a current pulse signal by interrupting a current flowing through an electric load and a diode, wherein the electric load and the diode are in series connection with a first conductor to be explored among one or more conductors, which are connected to both ends of a secondary winding of the distribution transformer; a power supply unit for supplying an operating power of the exploration current generator, wherein the power supply unit is connected to one of the one or more conductors except for the first conductor; a current pulse generation time control unit for controlling an operation of the switching unit; a current pulse generation time calculation unit for controlling an operation time of the switching unit; a voltage measuring unit for measuring a voltage at both ends of the switching unit; a current measuring unit for measuring a current flown by an operation of the switching unit; and a temperature measuring unit for sensing a surface temperature of the switching unit.

Alternatively, the buried path probe comprising: a magnetic field sensor, which is positioned perpendicular to the buried direction of the high voltage power line, for receiving a magnetic field signal corresponding to a generation time of the current pulse signal generated from the exploration current generator; a band filter for removing a load current and an out-of-band signal by band filtering the magnetic field signal received by the magnetic field sensor; a signal amplifying unit for amplifying a signal passing through the band filter; an ADC for converting an analog signal that has passed through the signal amplifying unit to a digital signal; a signal detection time management unit for detecting a signal corresponding to a pulse signal generation time from the digital signal converted by the ADC; a pulse signal information storage unit for providing a generation time and period information of a pulse signal stored in the signal detection time management unit to the signal detection time management unit; a pulse signal determination unit for determining whether a signal passed through the signal detection time management unit is genuine; and a pulse signal magnitude display unit for displaying pulse signal information passing through the pulse signal determination unit.

Alternatively, the reverse current limiter may be installed without separating an outer conductor of the high voltage power line by having a combination structure of one or more cylindrical detachable ferrite cores, wherein the ferrite core generates resistance by resonating at a specific frequency of a pulse current in order to ultimately minimize an impact of a signal emitted by a forward pulse current by controlling conducted emission noise flowing through the external conductor of the high voltage power line.

Alternatively, the stability-improved high voltage power line exploration apparatus further comprising: a network module for transmitting and receiving signal information of a current pulse signal generated from the exploration current generator and signal information of a current pulse signal based on a magnetic field signal measured from the buried path probe, by connecting communication between the exploration current generator and the buried path probe.

Alternatively, the exploration current generator further comprising: a voltage rise limiting unit for controlling the voltage rise when the switching unit operates, wherein the voltage rise limiting unit is configured as a combination of a snubber, a voltage limiter, and inductor chokes.

Alternatively, the buried path probe may store information of a pulse signal generation time and period into the pulse signal information storage unit without using a network module, by receiving a magnetic field signal through the magnetic field sensor near the exploration current generator.

Another exemplary embodiment of the present disclosure provides a method for exploring a high voltage power line path with improved stability. The method comprising: generating a current pulse signal inversely proportional to a winding ratio so as to detect an electromagnetic field signal around the high voltage power line through an exploration current generator connected to a secondary winding of a distribution transformer; and determining a buried path and connection configuration of the high voltage power line through a buried path probe that detects the electromagnetic field signal generated corresponding to a current pulse signal generated by the exploration current generator; and wherein the generating a current pulse signal inversely proportional to a winding ratio so as to detect an electromagnetic field signal around the high voltage power line through an exploration current generator connected to a secondary winding of a distribution transformer comprises: controlling a pulse generation operation of the switching unit by preferentially supply a bipolar voltage before generating the current pulse signal.

According to exemplary embodiments of the present disclosure, an apparatus and a method can be provided, which are capable of safely exploring a buried path of a high-voltage power line in a live line operation state with improved stability.

BRIEF DESCRIPTION OF THE DRAWINGS

Various aspects are now described with reference to the drawings and like reference numerals are generally used to designate like elements. In the following exemplary embodiments, for the purpose of description, multiple specific detailed matters are presented to provide general understanding of one or more aspects. However, it will be apparent that the aspect(s) can be executed without the detailed matters.

DETAILED DESCRIPTION

Figure 1:
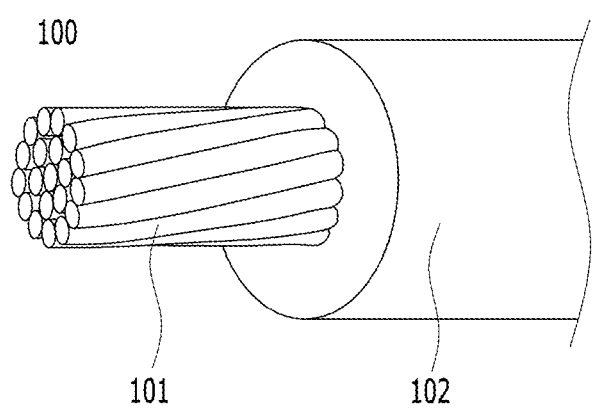
FIG. 1 is a structure of a general low-voltage power line.

Various exemplary embodiments will now be described with reference to drawings. In the present specification, various descriptions are presented to provide appreciation of the present disclosure. However, it is apparent that the exemplary embodiments can be executed without the specific description.

The term "or" is intended to mean not exclusive "or" but inclusive "or". That is, when not separately specified or not clear in terms of a context, a sentence "X uses A or B" is intended to mean one of the natural inclusive substitutions. That is, the sentence "X uses A or B" may be applied to any of the case where X uses A, the case where X uses B, or the case where X uses both A and B. Further, it should be understood that the term "and/or" used in this specification designates and includes all available combinations of one or more items among enumerated related items.

It should be appreciated that the term "comprise" and/or "comprising" means presence of corresponding features and/or components. However, it should be appreciated that the term "comprises" and/or "comprising" means that presence or addition of one or more other features, components, and/or a group thereof is not excluded. Further, when not separately specified or it is not clear in terms of the context that a singular form is indicated, it should be construed that the singular form generally means "one or more" in this specification and the claims.

Those skilled in the art need to additionally recognize that various illustrative logical blocks, configurations, modules, circuits, means, logic, and algorithm steps described in connection with the exemplary embodiments disclosed herein may be implemented as electronic hardware, computer software, or combinations of both sides. To clearly illustrate the interchangeability of hardware and software, various illustrative components, blocks, structures, means, logic, modules, circuits, and steps have been described above generally in terms of their functionalities. Whether the functionalities are implemented as the hardware or software depends on a specific application and design restrictions given to an entire system. Skilled artisans may implement the described functionalities in various ways for each particular application. However, such implementation decisions should not be interpreted as causing a departure from the scope of the present disclosure.

Specifically, impulse current signals have been utilized to identify a buried path or branch connection configuration by tracing power lines buried underground or underwater, or concealed in customer buildings. Specifically, multiple current pulses may be generated in a very short moment between a phase line and a neutral line of a low-voltage power line, and an electromagnetic field signal generated in response to a corresponding current pulse signal in a low-voltage power line and a high-voltage power line is traced to determine a path of a power line and a configuration of connections between power devices.

Figure 2:
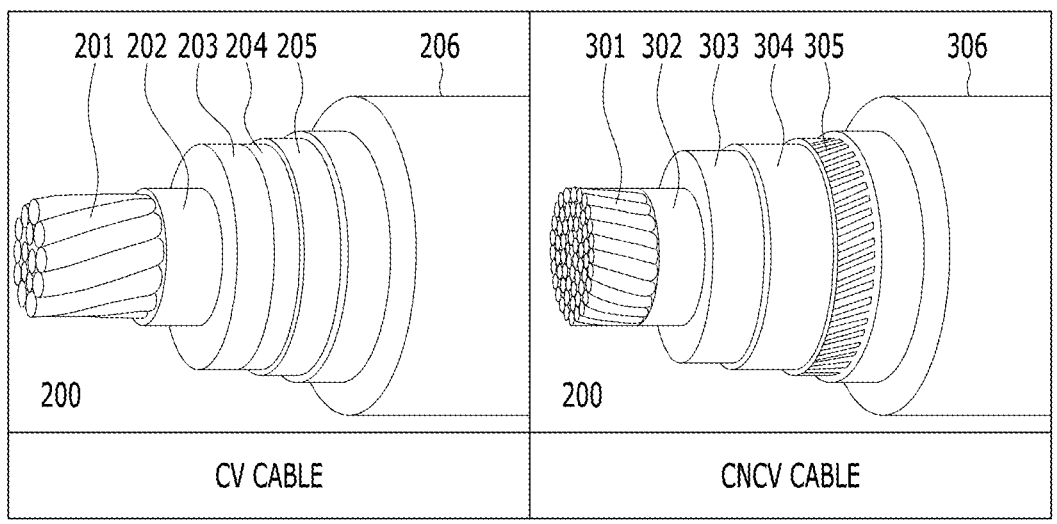
FIG. 2 is a structure of a high-voltage power line having an external conductor.

In general, the low-voltage power line and the high-voltage power line may be configured in different structures. More specifically, as illustrated in FIG. 1, a low-voltage power line 100 used in a low-voltage system has a simple structure constituted by a conductor 101 and an insulator 102 covering the same. On the other hand, as illustrated in FIG. 2, high-voltage power lines 200 and 300 used in a high-voltage system may be constituted by conductors 201 and 301, internal semi-conductive layers 202 and 302, insulators 203 and 303, external semi-conductive layers 204 and 304, external conductors (sheath conductor) 205 and 305, and external insulators 206 and 306, and the external conductor (sheath conductor) (205, 305) having a separate shielding function outside the cable is separately grounded to form a uniform electric field on the surface of the insulator (203, 303) and to reduce the risk of electric shock. The high-voltage power lines 200 and 300 may be classified according to types of external conductors 205 and 305 provided outside the power line. Specifically, in respect to the high-voltage power lines 200 and 300, the external conductor (sheath) positioned outside the power line having the shielding function may be classified into a CV cable 200 which is a copper tape having a comparatively low current capacity in a neutral line ungrounded operation system and classified into a CNCV cable 300 having a copper stranded wire 305 so that a current such as a fault current flows in a direct neutral grounded system.

As described above, there are conventional techniques that provide a method for distinguishing the buried path and a connection configuration (line) of the high-voltage power line configured so that the high-voltage power line has an external conductor having a separate external shielding (sheath) separately in addition to a conductor transmitting power to form an electric field equilibrium.

Figure 3:
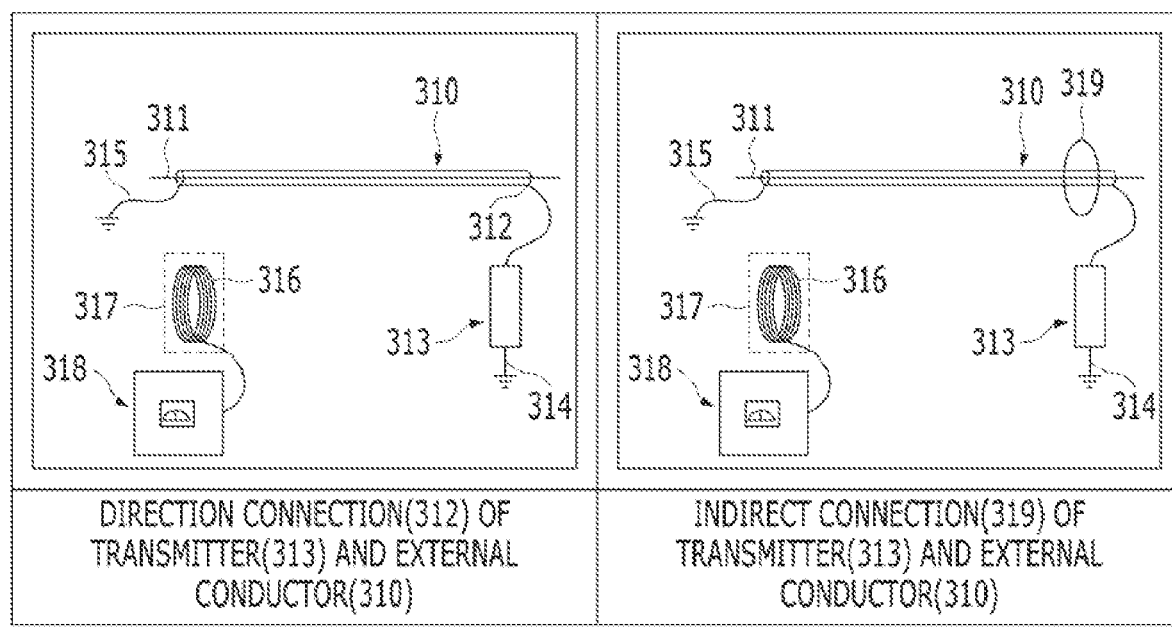
FIG. 3 is an exemplary diagram of the related art.

FIG. 3 illustrates a method for exploring a buried path of a power line when a power line is in a live line operation state in the related art. When specifically described with reference to FIG. 3, in the case of the related art, when a conductor 311 of the high-voltage power line is charged with the high voltage (i.e., the power cable is energized) and the high-voltage power line is in a live line operation, one side end of an external conductor 310 connected to the earth (314 and 315) at both ends of the power line may be directly connected to a transmitter (312) or inductively coupled through an inductance coil (319). Further, an exploration signal output from the transmitter connected to one side end of the external conductor 310 may be received by a receiver 318 through a clamp 317 provided the other one side end (i.e., an opposite side to one side end to which the transmitter is connected) (316) and as the related art, a method and an apparatus for determining a connection configuration of the high-voltage power line by receiving the corresponding exploration signal are described.

However, in a field in which the power line is installed, a combination of three high-voltage power lines is used in order to transmit a three-phase power instead of a single-phase power.

Figure 4:
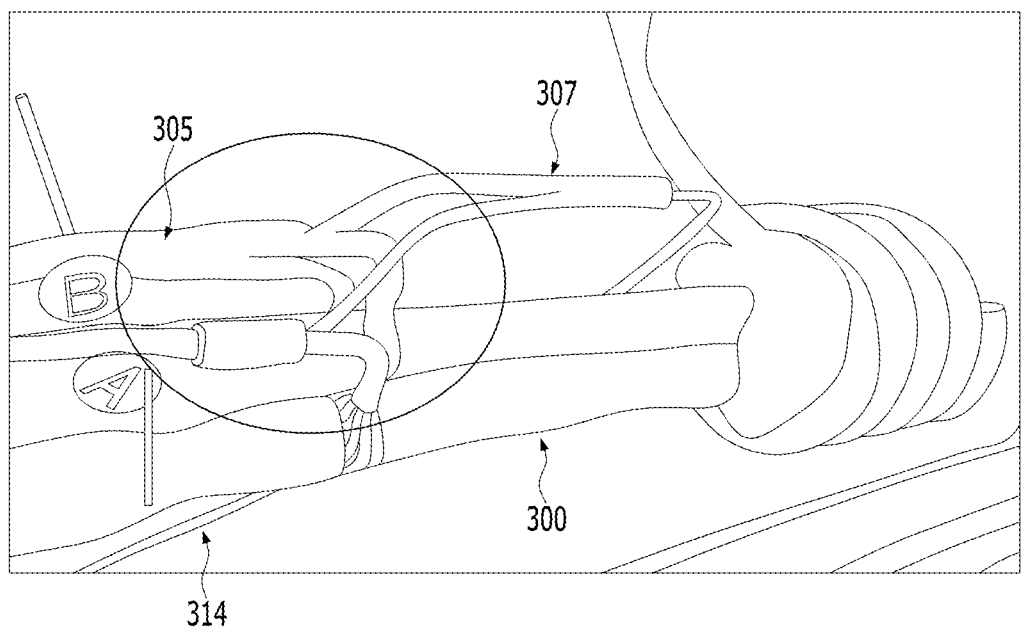
FIG. 4 is a diagram illustrating a state in which an external conductor of a three-phase high voltage power line is commonly connected and grounded in a field.

FIG. 4 is a diagram illustrating a state in which three high-voltage power lines supply a three-phase power in the area where an external conductor is commonly jointed and then grounded. It shows that three outer conductors 305 included in the three-phase high-voltage power lines 300 are respectively commonly jointed (307) and grounded (314). Since three external conductors 305 are firmly connected as such, in order to connect the transmitter and the receiver (i.e., clamp) to both side ends of each external conductor every exploration time in order to implement the related art, it may be inefficient to cut and/or separate the external conductor 305 of each high-voltage power line and connect the external conductor 305 again for restoring the external conductor 305 to an original state after completion of the exploration. Further, since the high-voltage power line is charged with the high voltage in a live line state when an external conductor ground 314 of the high-voltage power line is cut and/or separated, the high voltage due to the fault current may be generated, and as a result, a severe safety accident may occur.

Figure 5:
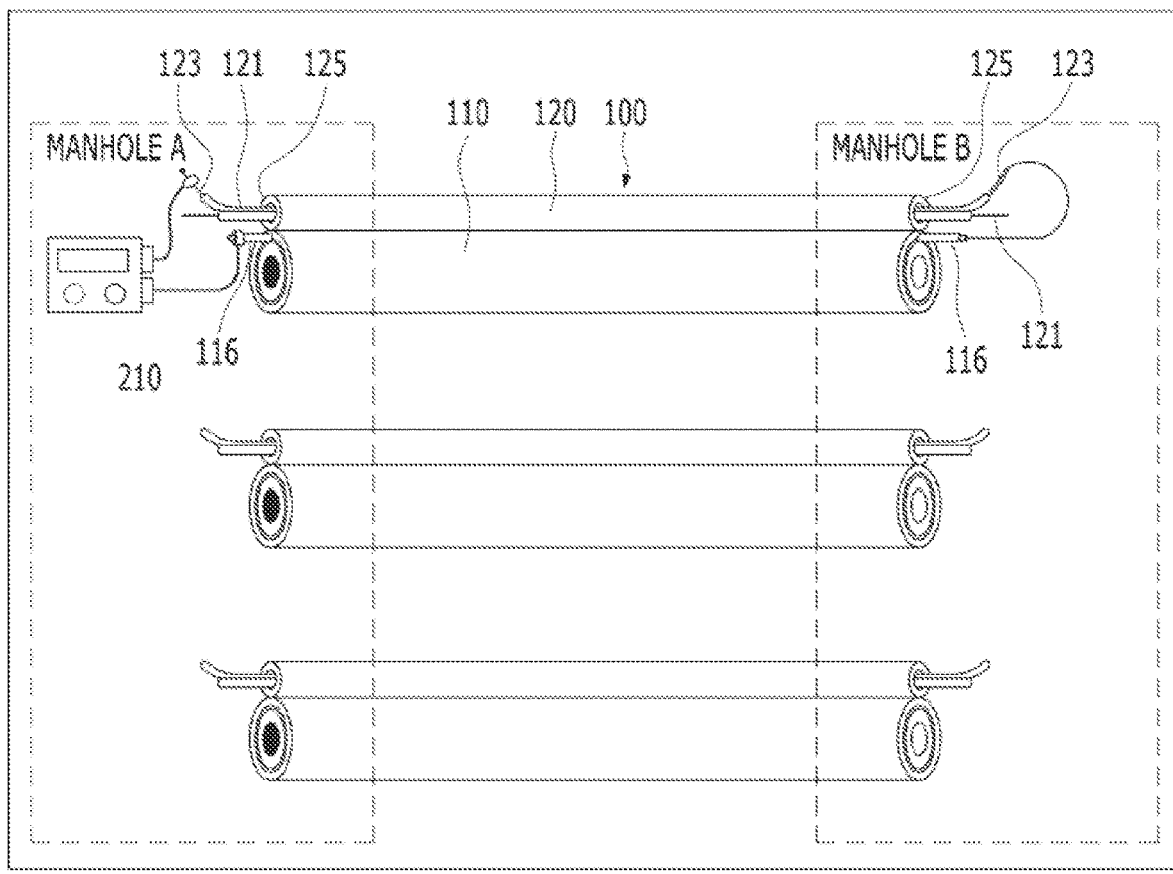
FIG. 5 is an exemplary diagram of the related art.

As a result, in another related art, a method for exploring the high-voltage power line by additionally providing a separate exploration electric cable is disclosed. Specifically, referring to FIG. 5, in the related art, a power line in which a separate exploration electric cable 120 is added to a high-voltage cable 110 to be explored is provided in a configuration of a three-phase power line 100 and both terminals of a detector 210 are connected to a conductor 121 of the exploration electric cable 120 of the corresponding power line and the external conductor of the high-voltage power line, respectively (123 and 116) to transmit a pulse signal, thereby detecting the high-voltage power line. However, the cable is not installed in an actual field and replacing the existing high-voltage cable with the cable added with the exploration electric cable as in the related art is unreasonable, and as a result, the cable added with the exploration electric cable is not used.

There is another related art for a method and an apparatus for exploring a high-voltage cable in a non-live line environment. Specifically, referring to FIG. 6, as the related art, the conductor 301 of the high-voltage cable 300 which is charged with the high voltage in a live line mode may be made to zero voltage (i.e., non-live line), and thereafter, a transmitter 401 is possibly connected to the conductor to transmit an exploration signal (404). Further, in the related art, a method is described, which may configure a circuit which feeds back the exploration signal by making a Loop at 405 by connecting the conductor 301 and the external conductor 305 at an opposite side of the transmitter and distinguishes the high-voltage cable by detecting the exploration signal transmitted from the transmitter 401 by using a receiver 402 by winding circumferential surfaces of high-voltage cables 300A, 300B, and 300C through a magnetic field coil 403.

Figure 6:
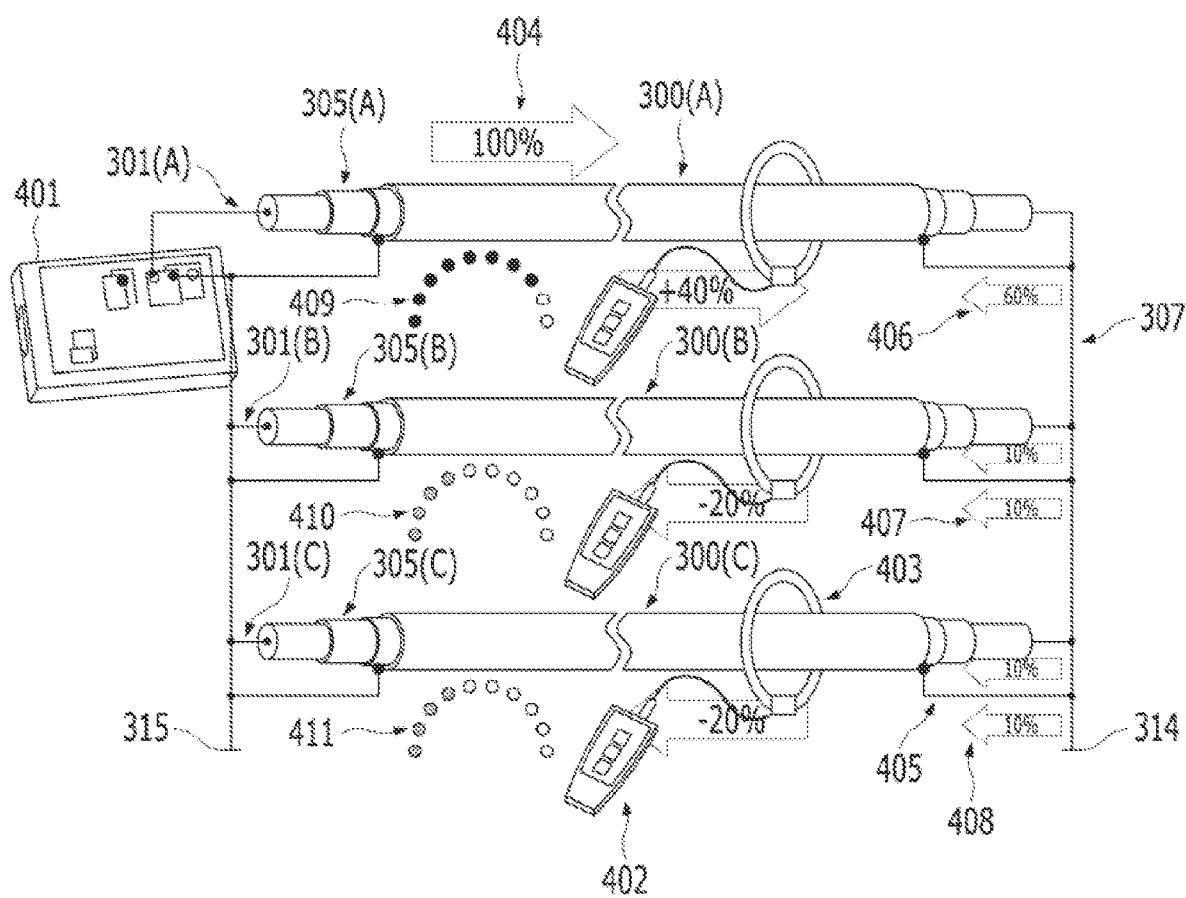
FIG. 6 is an exemplary diagram of the related art.

However, In the prior art as shown in FIG. 6, the loss of the detection signal transmitted from the transmitter is large, and there is a concern that the accuracy of signal detection may be somewhat lowered due to the influence of ambient noise. As a more specific example, when an exploration signal having a size of 100 is transmitted to a conductor 301A of phase A (300A) of the high-voltage cable to be explored in an installation section of the high-voltage cable (404), a current pulse signal having a size of 60 (i.e., 60% (406)) is fed back and flown to the external conductor 305A by the Loop 405 and current pulse signals having a size of 20 (i.e., 20% (407 and 408)) are fed back and flown to the external conductors 305B and 305C covering conductors 301B and 301C on two different phases. In this case, the forward direction exploration signal 404 having the size of 100 transmitted from the transmitter and the opposite direction exploration signal having the size of 60, which is fed back and flown to the external conductor 305A by the Loop 405 flow in reverse directions to each other, and as a result, an electromagnetic strength cancellation occurs between both-direction signals. That is, the exploration signal having the size of 100 transmitted from the transmitter 401 is cancelled some of transmitted signal by the opposite direction signal (i.e., the signal having the size of 60) fed back through the external conductor 305A, and as a result, only the exploration signal 409 having the size of 40 may be detected around the cable in the form of the magnetic field. Further, there is no signal in a forward direction (i.e., a direction in which the transmitter transmits the exploration signal) in the remaining two-phase cables, but a signal having a size of 20 may be each fed back through the external conductors 305B and 305C in a reverse direction (i.e., a direction in which the signal is fed back by the Loop) and signals 410 and 411 each having the size of 20 may be detected in the reverse direction by the receiver.

That is, the related art illustrated in FIG. 6 has a structure in which even though the exploration is performed by transmitting the current pulse signal to the center conductor 301 in non-live line operating state, firmly jointed three external conductors (305) of the three-phase cable (307) waste the signal by spreading it through the Loop 405, and as a result, only 40% of the transmitted current pulse signal may be detected by a buried path probe. As a result, the technology through the corresponding configuration could not be used in the live line operating state, and signal loss becomes large and may be thus affected by the ambient noise.

As still another related art, there is a technology for transmitting an exploration current pulse signal from a load side of the low-voltage power line such as a home or shopping center and detecting the transmitted exploration current pulse signal around both high-voltage and low-voltage power lines.

Figure 7:
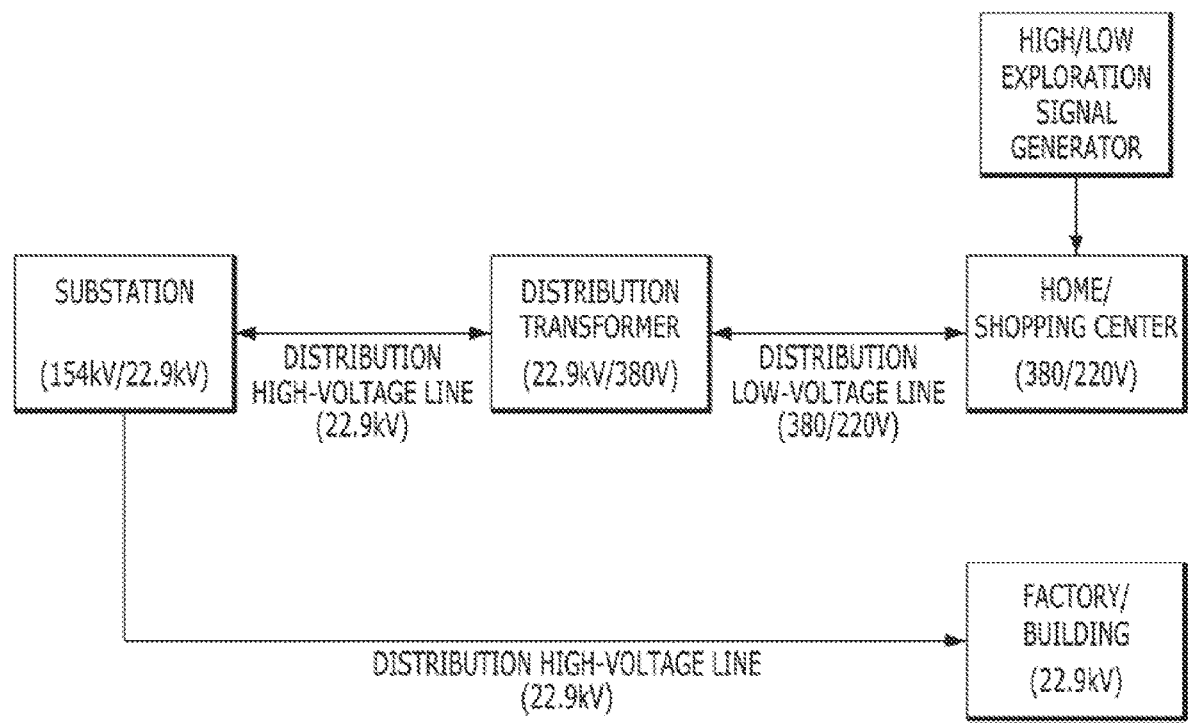
FIG. 7 is an exemplary diagram illustrating a configuration for exploration by connecting a signal generator at a load side to the source through a low-voltage cable in the related art.
Figure 8:
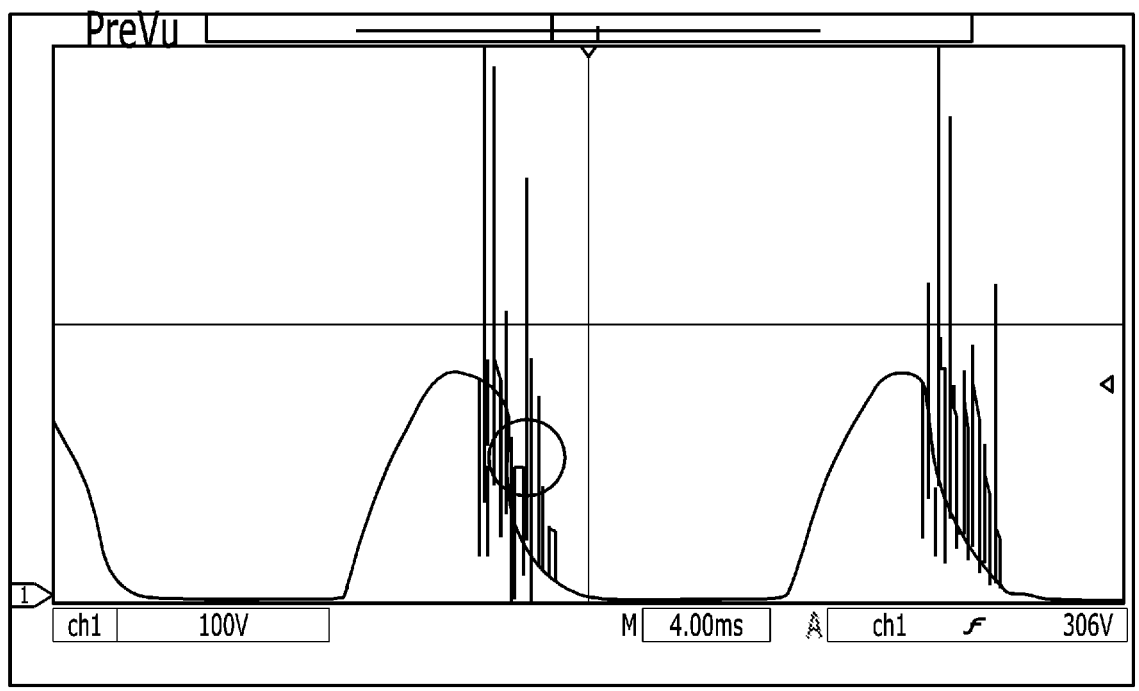
FIG. 8 illustrates a form of a waveform generated in the configuration of FIG. 7 as the related art.

More specifically described in FIGS. 7 and 8 the conventional technology can generate a group of current pulses with a retention time of 200 uS to explore high and low voltage power lines at the load side of the low voltage power line far from the power source such as a distribution transformer. In addition, it is possible to measure the quality of the low voltage power line by monitoring the change of an arcing voltage waveform from the low voltage power line in response to the current pulse group generated from the signal generator. At the same time, a group of current pulses generated from the signal generator connected to the load side of the low-voltage power line can be converted to the primary current through the transformer. In the related art as described above, it is advantageous in that when the current pulse signal is generated at the load side after passing through the low-voltage power line, an arc signal generated at a fault location due to poor connection of the low-voltage power line is detected at the load side, and as a result, it is possible to measure the quality of the low-voltage power line, while the waveform of the current pulse signal is distorted by a line constant of the low-voltage power line, and as a result, the distorted current pulse signal may reach the transformer at a power source side of a low-voltage line.

The distorted arriving waveform has a curved shape which does not maintain the characteristics of the time for which the square wave current pulse should be such as generated and the retention time, and can be reduced in magnitude by 1/60 when the current pulse signal is converted into the primary current by the transformer, and can be reduced again by the electromagnetic cancellation caused by the reverse current through the outer conductor of the high voltage power line.

For example, if the signal generator connected to the load side of the low voltage power line generates a current pulse signal of 500 A, the waveform distorted by the low voltage line upon reaching the transformer can be inductively coupled to the primary winding of the transformer having a current ratio 220 V/13, 200V of 1/60 to be converted to a current pulse signal having a magnitude of about 8 A. That is, a current pulse having a magnitude of 8 A flows by the transformer to a high voltage power line. However, as described above, as all the external conductor are jointed and grounded together in common, the current pulse flowing through the transformer to the high voltage power line is cancelled (i.e., 60%) by the return current so that the electromagnetic field signal corresponding to 40% is detected around the high voltage power line. That is, a current pulse signal having a size of 8 A is lost to have a magnitude of 3.2 A is converted into an electromagnetic field signal to be detected by a buried path probe. As a result, the related art has a problem in that when a high current signal having a size of 500 A is generated at a customer side connected to the low-voltage line by considering the current transformation ratio in the distribution transformer, a high current exploration signal is affected by the line constant of the low-voltage line and transformed into a current pulse not having generation and holding time characteristics of the pulse and reaches the distribution transformer and even though the current pulse signal having the distorted waveform is reduced to the size of 1/60 by the current transformation ratio and transformed into a high-voltage current, if only 40% is used due to the reverse feedback current which flows on the external conductor of the high-voltage power line, the ambient noise and the load current may not be distinguished from each other.

In other words, there is a need for a technology in which waveform distortion of the current pulse signal in the live-line state is minimized even in a place where a high-voltage cable having not a single phase but three phases is installed and the external conductor of the high-voltage power line is commonly connected no to be affected by a grounded environment, and as a result, it is possible to explore the high-voltage power line without distortion and signal loss of the current pulse signal.

In order to solve the problems described above, in the present disclosure, the exploration current generator (i.e., exploration current generation module) is provided in proximity to the distribution transformer so that the waveform of the exploration current signal is maintained as much as possible to reach the winding of the distribution transformer. Hereinafter, the configuration and operation of the high-voltage power line exploration apparatus of the present disclosure, which compensates for the aforementioned problem will be described in detail.

Figure 9:
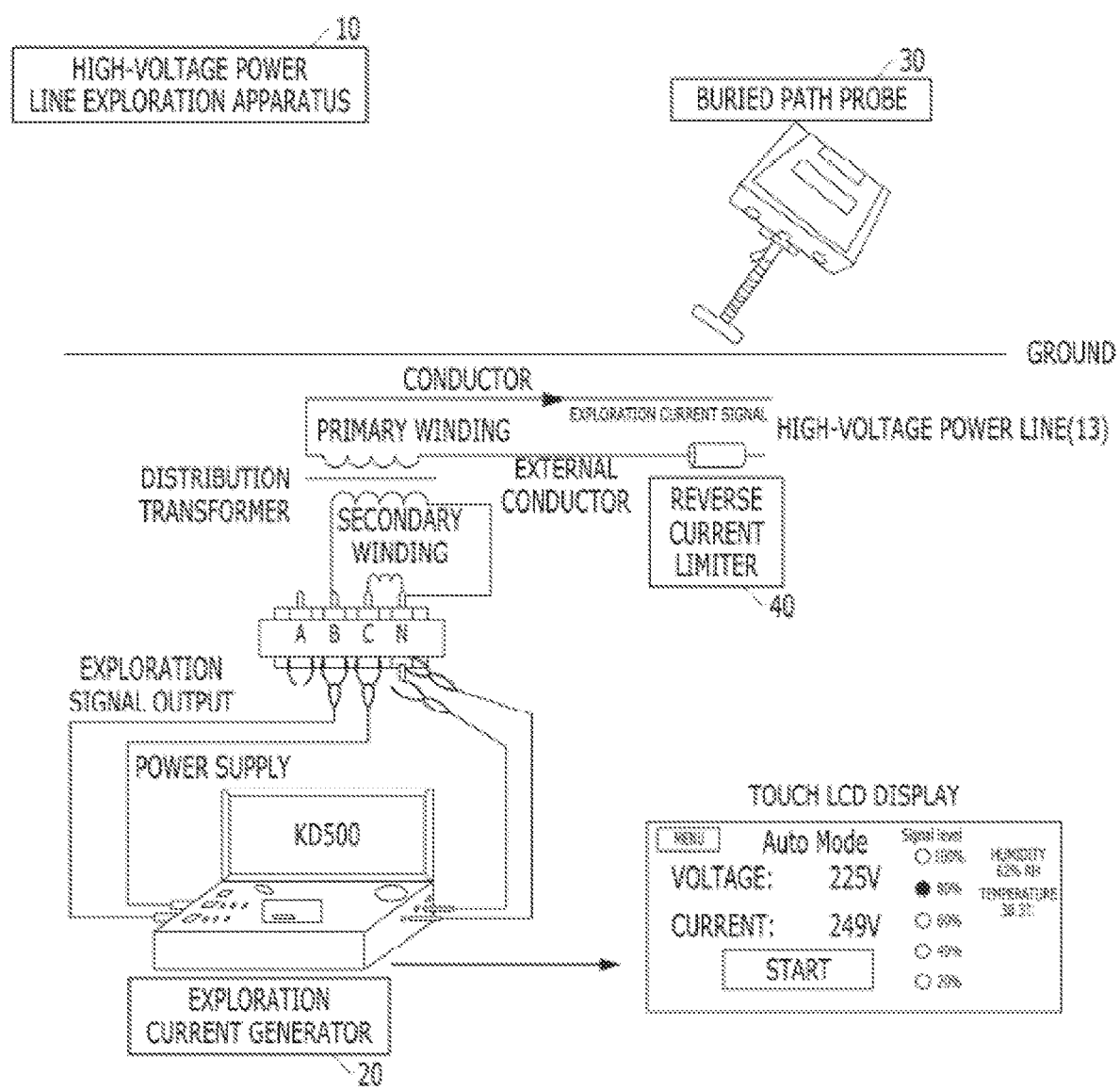
FIG. 9 illustrates a configuration of a high-voltage power line exploration apparatus according to an exemplary embodiment of the present disclosure.

A high-voltage power line path exploration apparatus 10 of the present disclosure may include an exploration current generator 20 for generating the current pulse signal for exploring the high-voltage power line 13, the buried path probe 30, and a reverse current limiter 40 as illustrated in FIG. 9.

Figure 10:
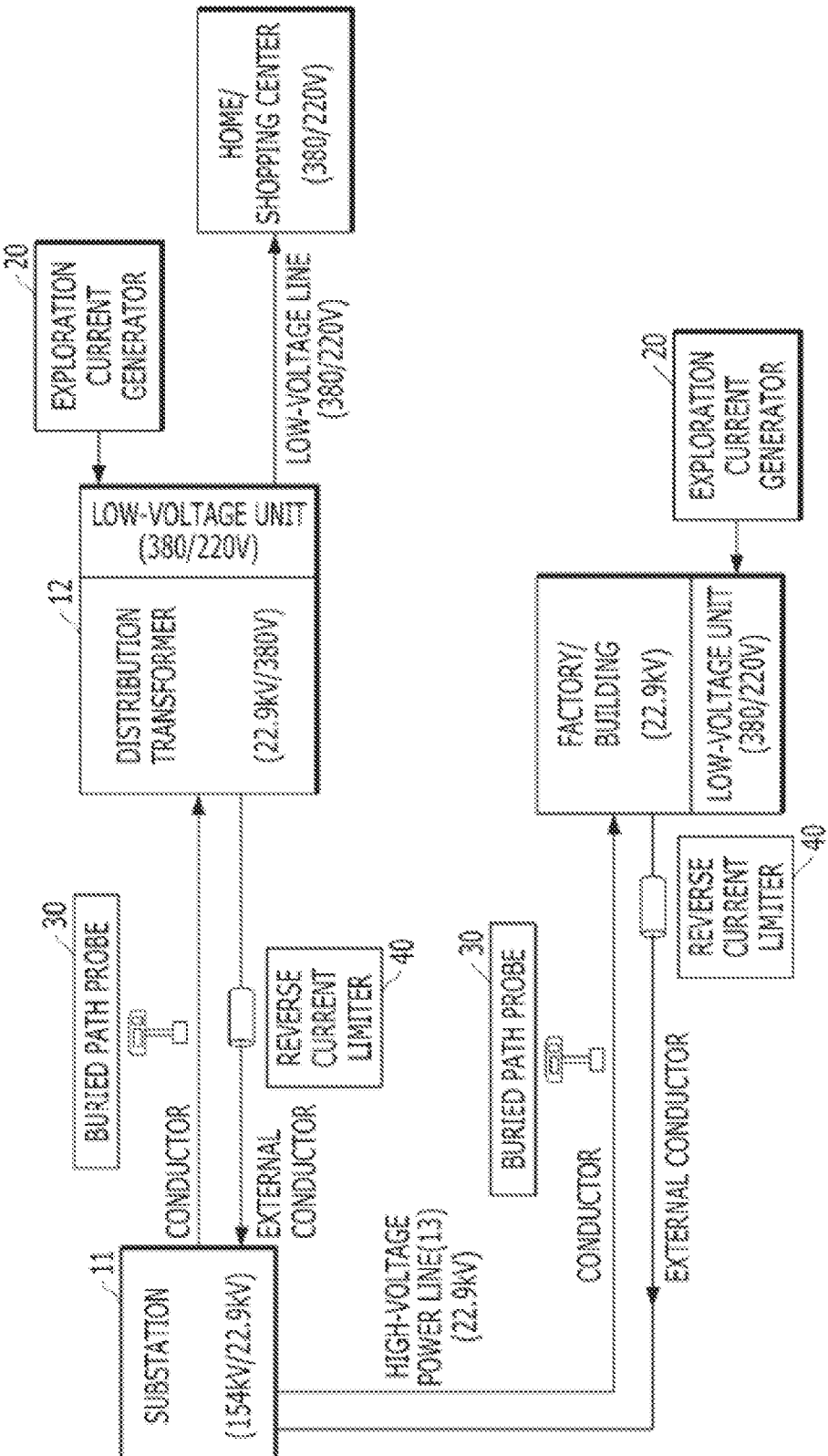
FIG. 10 shows that the current pulse signal is generated at the closest position to the distribution transformer rather than the load side after the low-voltage line, as shown in FIG. 7 according to an embodiment of the present disclosure.

FIG. 10 illustrates another method of the present disclosure. A configuration is described, in which the exploration current generator 20 being installed closest to a distribution transformer (12) to explore a high voltage power line (13) supplying power from a substation (11) to a distribution transformer (12) or to a high voltage customer (factory/building), unlike previous technologies.

Figure 11:
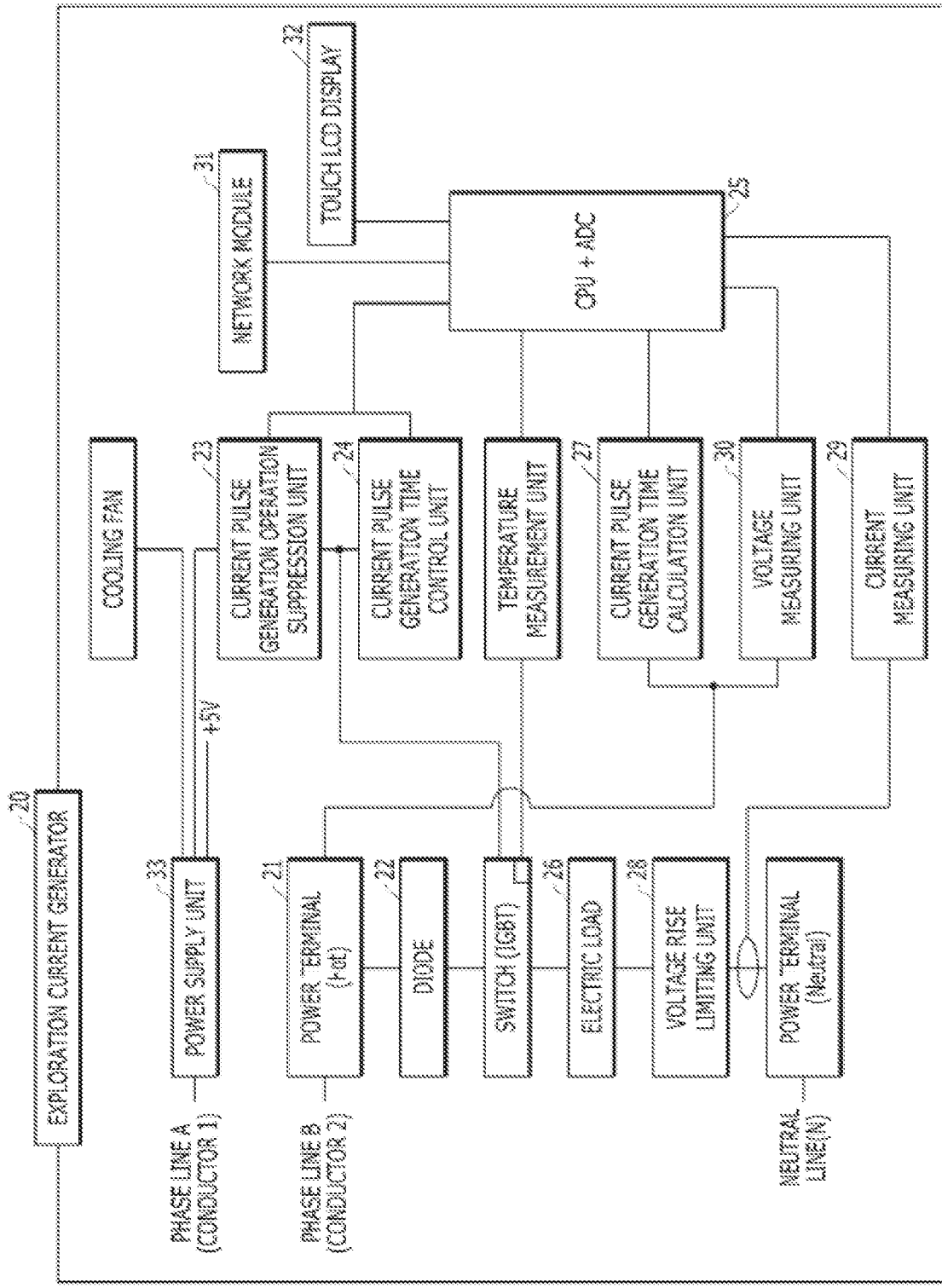
FIG. 11 illustrates a configuration of an exploration current generator according to an exemplary embodiment of the present disclosure.

As illustrated in FIG. 11, the exploration current generator 20 is constituted by a power source terminal 21 connected to a low-voltage power line to be measured, a diode 22 for half-wave rectifying input voltage, a switching element (IGBT) for generating the current pulse, an operation suppressing unit 23 for suppressing the switching element operation, a current generation time control unit 24 for receiving a current pulse generation signal from a DSP which is a main processing unit and transforming the received current pulse generation signal into an IGBT gate signal in order to transmit the received current pulse generation signal to the IGBT, an operation device unit 25 constituted by a DSP processor and an external interface, an electric load 26 for limiting current generated by the switching element operation, a current pulse generation time calculation unit 27 calculating the current pulse generation time by detecting a Zero Crossing Trigger signal, a voltage rise limiting unit 28 for limiting the rise of a power source voltage during the switching element operation, a current measuring unit 29 for measuring the current which flows on the load 26, a voltage measuring unit 30 for measuring a Vce voltage, a network module 31 for synchronizing the buried path probe and current pulse generation time information, a touch LCD display 32 for operating the exploration current generator, and a power supply unit 33 for supplying a bipolar voltage power. The aforementioned components are exemplars and the scope of the present disclosure is not limited to the aforementioned components. That is, additional components may be included or some of the aforementioned components may be omitted according to implementation aspects of exemplary embodiments of the present disclosure. In the present disclosure, the term "element" and the term "unit" can be used interchangeably for meaning at least a part of configurations.

According to an exemplary embodiment of the present disclosure, a reference point for generating the current pulse signal at an accurate time in synchronization with a power frequency 50 or 60 Hz is required for the exploration current generator 20 to generate the current pulse. To this end, the current pulse generation time may be calculated with a point which meets when the power voltage falls among Zero crossing points as the reference point and the current pulse generation time information may be continuously provided to the DSP as a Trigger signal. Since the current pulse generation time calculation unit 27 uses a high-speed DSP processor of 600 MHz in order to process the Trigger signal, the DSP may accurately recognize the Trigger signal only when a Ramp Time should maintain 50 nsec or less. A switching element (1200V 400 A IGBT*2) is accurately operated at a desired time by using the Trigger signal to control a magnitude and duration of the current pulse.

According to an exemplary embodiment of the present disclosure, the exploration current generator 20 of the high-voltage power line path exploration apparatus 10 may be directly connected to and provided in the low-voltage terminal 21 of the distribution transformer as illustrated in FIGS. 9 and 10. As such, it may be interpreted that when the exploration current generator 20 for generating the current pulse signal is disposed nearest to the distribution transformer, a capacitance of the low-voltage line is disregarded and the exploration current generation switching element (IGBT) is connected to a reactance coil of the transformer in series to just generate the current pulse signal. That is, the current pulse signal is not affected by the line constant of the low-voltage line and is directly connected to the winding of the inductive coupling circuit of the transformer to transform the current pulse signal into the high voltage. Directly connecting the exploration current generator to the low-voltage terminal of the distribution transformer of the present disclosure is just one example and the present disclosure is not limited thereto.

Figure 12:
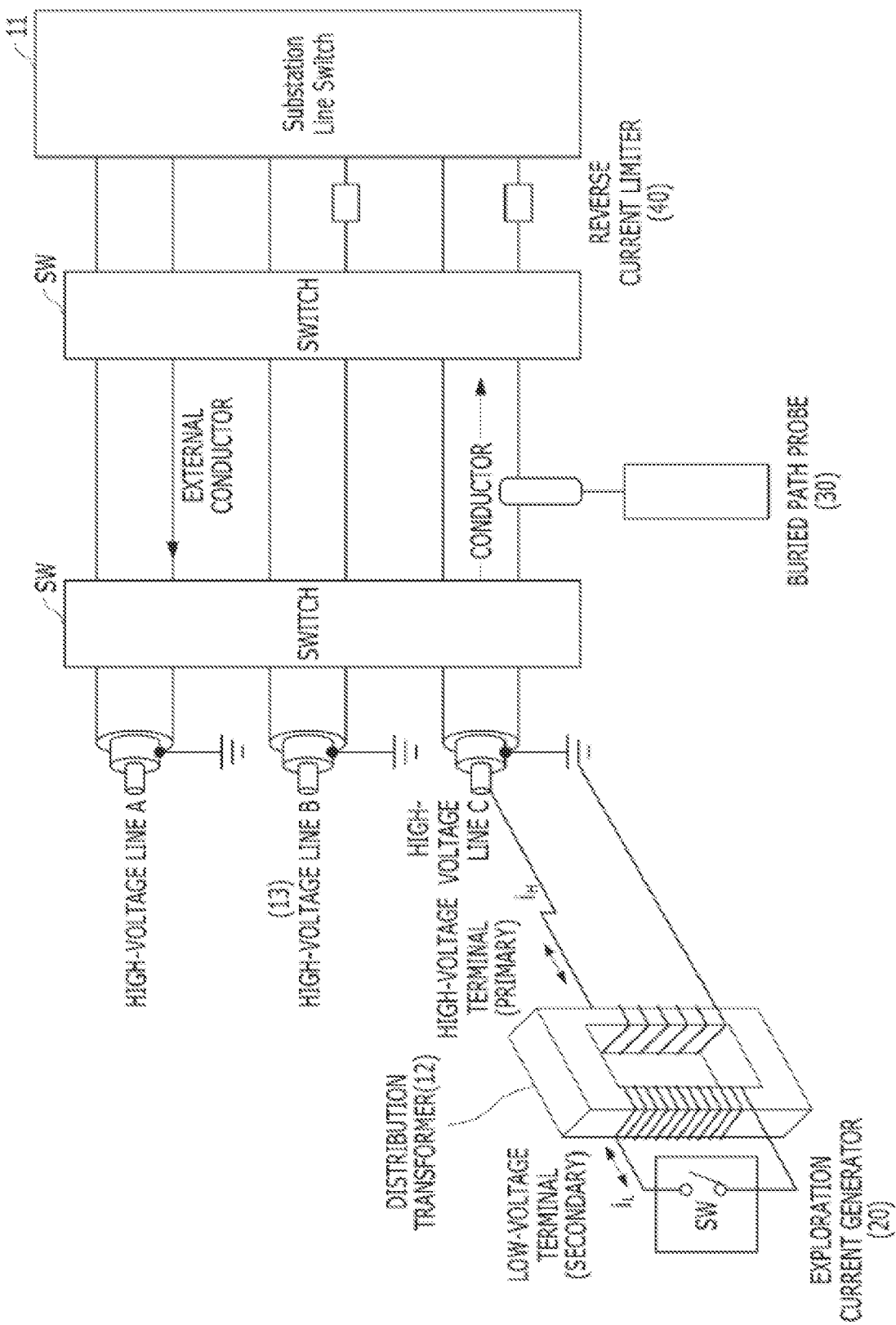
FIG. 12 illustrates an overall configuration of a power distribution system according to an exemplary embodiment of the present disclosure.

As illustrated in FIG. 12, the high-voltage power line path exploration apparatus of the present disclosure detects the magnetic field signal emitted around the high-voltage power line through the buried path probe 30 according to a power source up to a secondary power source of a substation LS (Line Switch) 11 which is a final power source from the distribution transformer 12 to explore a connection configuration at a buried location and each branch location of the high-voltage power line 13.

Figure 13:
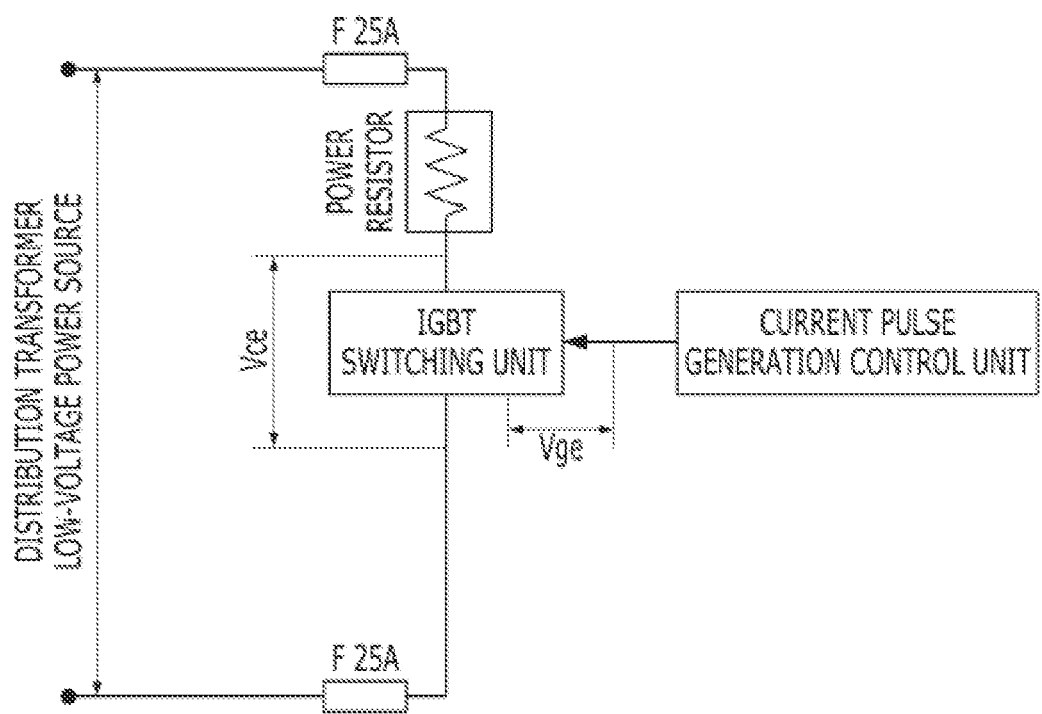
FIG. 13 describes a power supply of Vge for operating a switch of an exploration current generator and a position for measuring voltage of Vce when a current pulse signal is generated by the switch operation.

FIG. 13 describes measurement points of Vce and Vge which are voltages around the exploration current generator switching element (IGBT) in the present disclosure. Vge which is the gate voltage for operating the switching element (IGBT) and the voltage Vce applied to both ends of the power source terminal when the switching element is operated because the voltage varies.

According to the present disclosure, when the exploration current generator 20 for generating the current pulse signal on the power line is disposed adjacent to the transformer, a malfunction of the switching element of the exploration current generator 20 may occur due to a reactance of the transformer. More specifically, when the switching element of the exploration current generator connected adjacent to the transformer turns on/off the current pulse at a high speed, the malfunction of the switching element may occur by the change in power voltage by the corresponding on/off operation.

Figure 14:
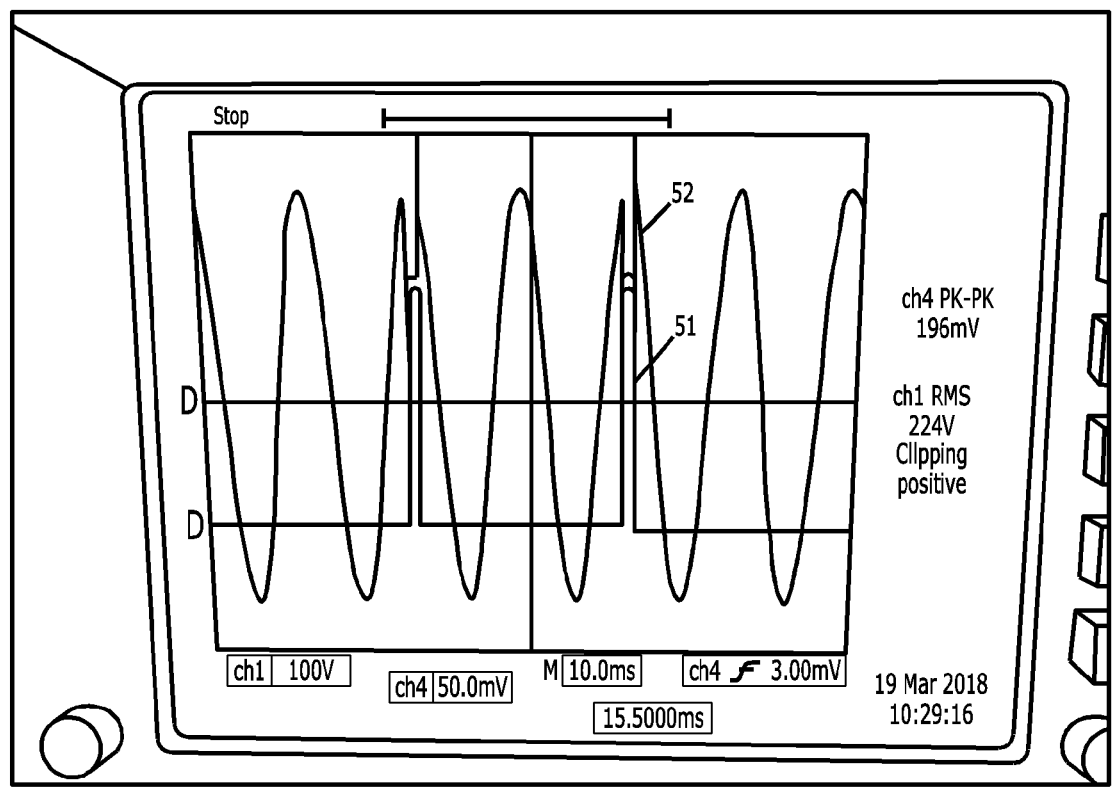
FIG. 14 illustrates a relationship waveforms of Vge and Vce when a current pulse signal is generated in the related art.

FIG. 14 is a diagram illustrating a change of an AC sine wave voltage waveform 52 generated when a power source has a large reactive component, such as a transformer, is current-switched at high speed (51). For example, when a current pulse is generated by the switching element of the exploration current generator connected to the transformer's low-voltage terminal (i.e., switch on) and such a quick current increase may causes the voltage momentarily drops, but when the switching element blocks the current flow rapidly (i.e., switch off), the voltage may be surged due to the transformer's reaction.

Figure 15:
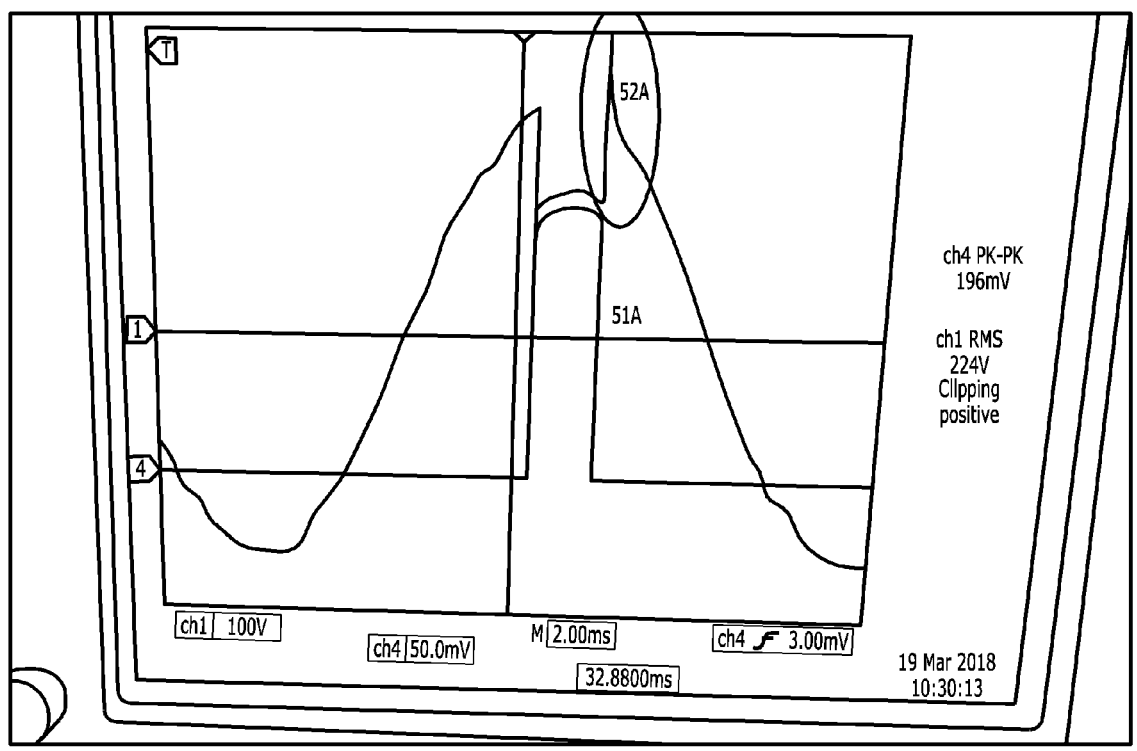
FIG. 15 illustrates a waveform acquired by enlarging FIG. 14.

Referring to a voltage waveform enlarged as illustrated in FIG. 15, that is, in the case of the switch on, the power voltage Vce may be rapidly reduced by a di/dt phenomenon, and as a result, Vge (a voltage between a gate and an emitter) is affected and the switching element may thus malfunction and be turned off and further, when the switch is turned off, the Vce voltage rapidly rises due to the voltage rise (52A) and simultaneously, affects Vge to rise, thereby turning on the switching element.

As such, when the exploration current generator 20 including an element for performing a switching operation in a load having a low power resistance value in order to generate the current pulse signal operates in close proximity to the transformer having the inductance component, a measure for preventing the malfunction is required. According to an exemplary embodiment of the present disclosure, the exploration current generator 20 which generates the current pulse signal adjacent to the transformer may include a DC power supply unit for controlling the operation of the switching element through a bipolar voltage by receiving the power from a low-voltage line of the other phase.

Figure 16:
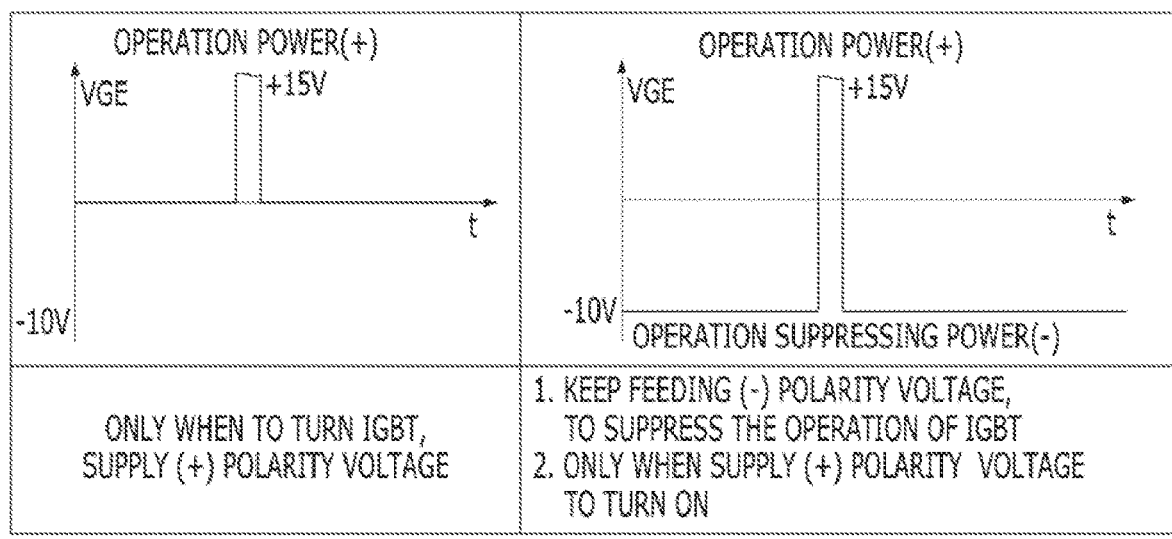
FIG. 16 illustrates a waveform comparison of Vge before and after the suppression (−) operating voltage applied.

As illustrated in FIG. 16, in the prior art, the (+) unipolar voltage is applied to (+) 10V or more in order to operate the switching element ON, and the (+) voltage is removed when the switch is turned off. This switching is controlled so that when a phenomenon such as a Vce voltage increase occurs, especially when the reactance component is directly connected to a load which occupies most of the reactance component as described in the present disclosure, the effect generated in the switch OFF cannot be ignored. In order to prevent the malfunction of the switching device, the switch OFF voltage is maintained below (−) 10V, so that the negative voltage is supplied even when the voltage of the command Vce is increased, thereby minimizing the influence of the negative voltage.

Figure 17:
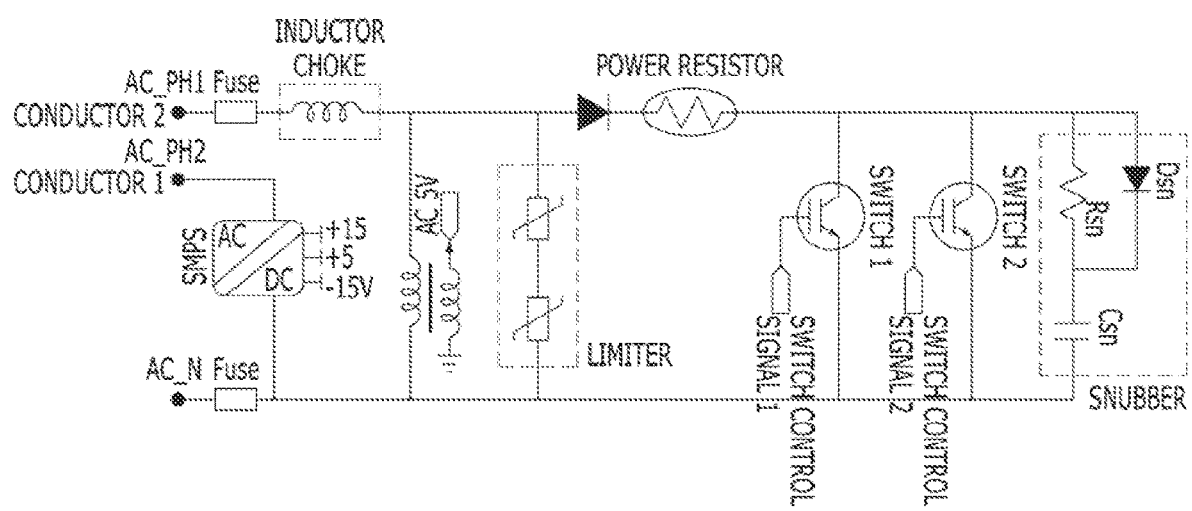
FIG. 17 illustrates a circuit for limiting a rise in commercial voltage when a current pulse signal is generated according to an exemplary embodiment of the present disclosure.

Specifically, in order to implement the supply of the aforementioned negative voltage, a DC power supply unit (SMPS) of the exploration current generator, as illustrated in FIG. 17, being connected to a terminal of a phase 2 (AC_PH2) that is not an exploration target (AC_PH1) among three-phase powers of the distribution transformer to conductor 1 to preferentially supply (−)15 V to the switch control signal unit (gate), thereby taking a measure to generate the current pulse signal after performing a suppressing function so as to prevent the malfunction due to an inter-terminal influence of the switching element even if the voltage fluctuates suddenly due to the operation of the load or switch element connected to the distribution transformer.

That is, as illustrated in FIG. 16, power is supplied to the DC power supply as the highest priority, and the on/off operation of the switching element is controlled by the bipolar power source, thereby doubling the operation voltage difference (−15~+15V) compare to the previous unipolar way (0 to +15V) to minimize the effect of the parasitic capacitance between the switching element gate and the emitter to achieve the stable exploration.

According to an exemplary embodiment of the present disclosure, when the exploration current generator performs the switching operation as illustrated in FIG. 17, in particular, when switching off, the exploration current generator may include the voltage rise limiting unit including a combination or a part of a snubber, a voltage limiter, and an inductor choke for controlling the voltage to momentary rising.

Figure 18:
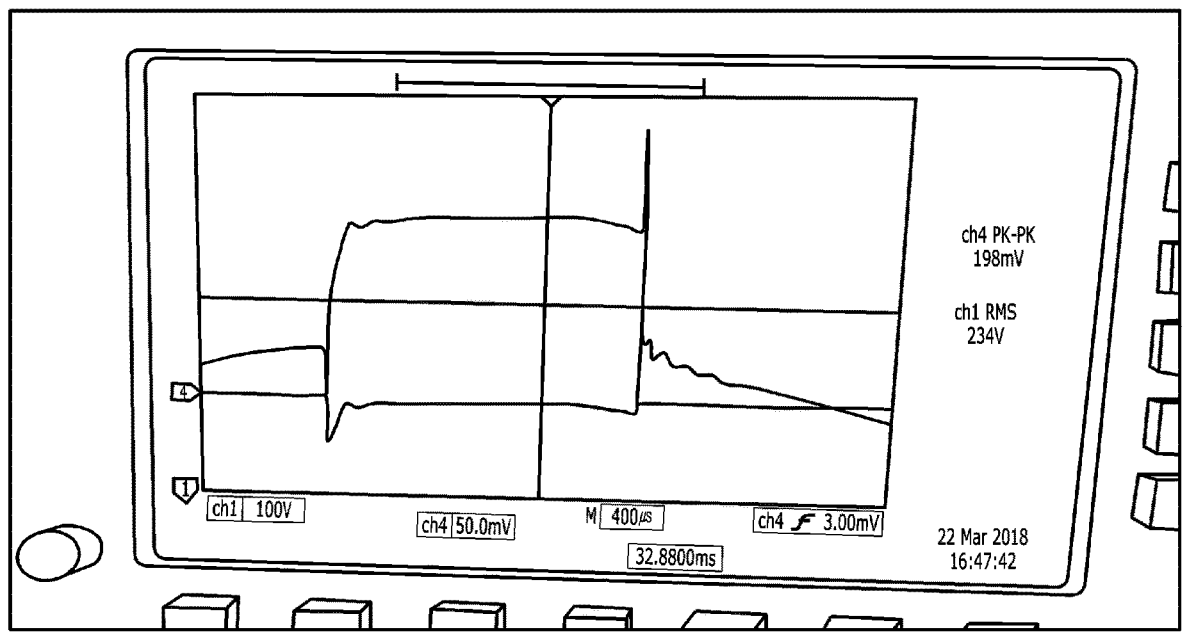
FIG. 18 illustrates a result of measuring a voltage of Vce when a voltage rise limiter including a snubber, a voltage limiter, and an inductor choke is added to an exploration current generator as illustrated in FIG. 17.

FIG. 18 illustrates a result of measuring a voltage of Vce rising when a voltage rise limiter including a snubber, a voltage limiter, and an inductor choke combined in a high-voltage power line path exploration apparatus according to the present disclosure. It is possible to minimize momentary rise in Vce voltage when switching off.

Figure 19:
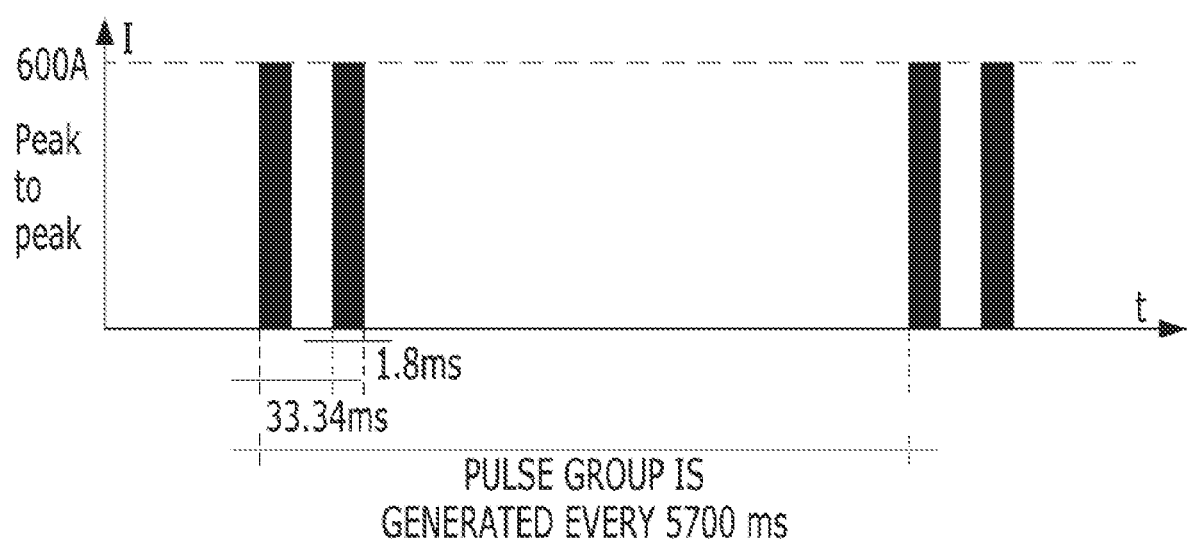
FIG. 19 illustrates a generation time and a generation period of a current pulse signal according to an exemplary embodiment of the present disclosure.

FIG. 19 illustrates a generation time and a period of a current pulse signal. In the related art, a low-voltage line contact fault phenomenon is detected by shortening a pulse holding time, but in the present disclosure, the pulse maintenance time is increased from 200 us to 1,800 us (1.8 ms) in order to minimize the distortion of the current pulse waveform. The interval between the pulses is 2 cycles (33.3 ms) to minimize the influence of the residual pulses so that the overvoltage would not be generated by combining between the residual charge voltage and the generated pulse voltage.

Figure 20:
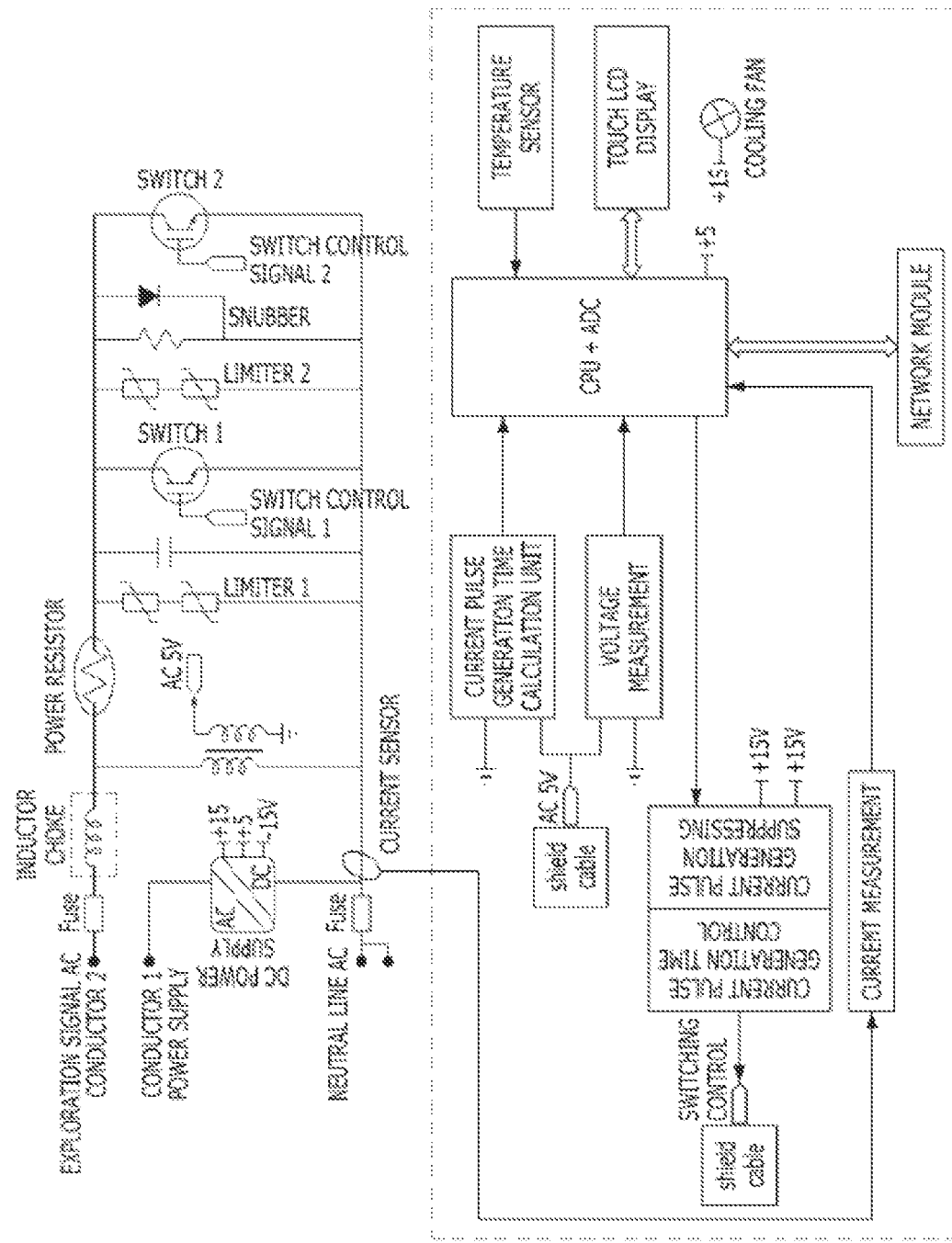
FIG. 20 is a drawing that illustrates the comprehensive structure of an exploration current generator according to an exemplary embodiment of the present disclosure.

As described above, for implementing a stable high-potential power line path exploration, all functions as illustrated in FIG. 20 are combined to prevent the malfunction of the switching element by providing the negative voltage, the momentary rise of the Vce voltage is minimized through the voltage rise limiting unit using the snubber, and the influence by reverse voltage is prevented by keeping the pulse current holding and generation intervals longer, thereby enabling safe exploration without influencing the existing power facility even though the high-current pulse signal is generated at the low-voltage terminal of the distribution transformer in order to explore the high-voltage lines.

In addition, the present invention can improve the accuracy of the exploration by improving the signal-to-noise ratio in order to be clearly distinguished from an electromagnetic field generated by a general load current even if the waveform is converted into a high-voltage current by being designed to be a stable operation.

The exploration current generator 20 of the high-voltage power line path exploration apparatus may detect a function abnormality early by measuring a pulse signal current and a rising voltage fluctuation during the switching operation, and constantly sensing the temperature of the surface of the switching element. In addition, the measurement results can be generated and recognized through the touch LCD display, such as an alarm.

The exploration current generator 20 may perform stable exploration by appropriate adjustment to suit site conditions to be adjusted through the touch LCD display so as to generate an exploration current pulse signal at 20% of the load flowing on the high-voltage power line 13.

According to an exemplary embodiment of the present disclosure, the high-voltage power line path exploration apparatus 10 may include a network module 31 connecting communications between the exploration current generator 20 and the buried path probe 30. Further, signal information of the current pulse signal generated from the exploration current generator 20 and signal information of the magnetic field signal generated in response to the current pulse signal measured from the buried path probe 30 may synchronize with each other through the network module 31. The signal information may include information on at least one of a time and a period of the current pulse signal and a time and a period of the magnetic field signal generated in response to the pulse signal.

Specifically, the exploration current generator 20 may transmit transformer and phase information to a line exploration module together with the pulse current signal at a predetermined interval from a zero crossing point on the low-voltage power line. As a result, the buried path probe 30 may synchronize the time and the period of the current pulse signal and the time and the period of the magnetic field signal generated from the high-voltage power line 13 in response to the current pulse signal through the transformer and phase information received from the exploration current generation module and the corresponding pulse current signal.

In another exemplary embodiment of the present disclosure, the high-voltage power line path exploration apparatus 10 allows the buried path probe 30 to detect the exploration electromagnetic field signal at the secondary side or primary side of the distribution transformer 12 to store the time of generation and period of current pulse signal in order to synchronize the time between the exploration current generator 20 and the buried path probe 30 without exchanging information through the network module 31. In the contrary, when a plurality of buried path probes 30 are used, time synchronization of the exploration signal may be achieved through mutual communications rather than storing the signal time into every device.

Figure 21:
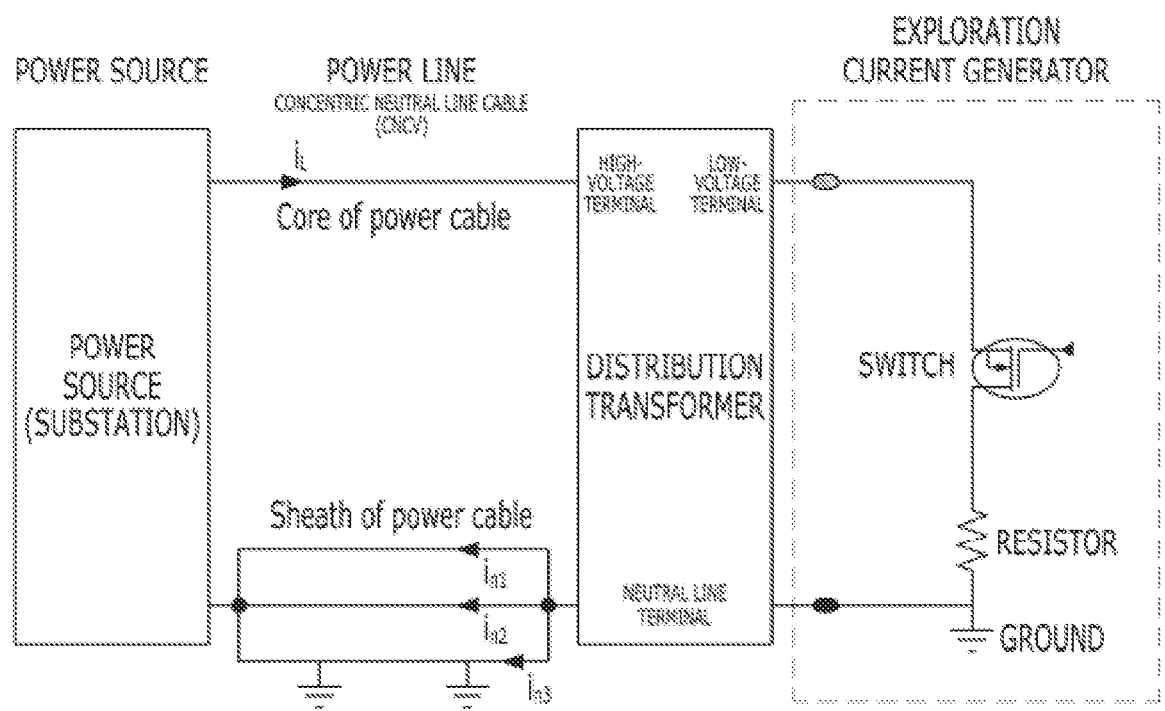
FIG. 21 is a diagram exemplarily illustrating a process of exploring a high-voltage power line through a current exploration signal of an exploration current generator according to an exemplary embodiment of the present disclosure.

FIG. 21 is a diagram exemplarily illustrating a process of exploring a high-voltage power line through an exploration current generation module according to an exemplary embodiment of the present disclosure.

As illustrated in FIG. 21, when the exploration current generator 20 is connected to the low voltage terminal of the distribution transformer 12 in a live line state to generate a current pulse signal, the current pulse signal is converted into a high voltage current to flow into the high voltage line attenuated by the inverse ratio of winding turns (60:1) which can be translated as a current change ratio (1:60) of the transformer. However, the current pulse signal flowing into the phase conductor is divided into three different returning paths through the external conductor (concentric neutral line) when the current pulse signals return to the substation direction. As mentioned above, the problem of the previous technology is that the external conductor is grounded after three are jointed in common, so that when 8 A is transmitted, only about 40% of the current pulse signals for exploration are detected as a probe signal (for example, when 500 A low voltage current pulse is generated, only the current pulse signal with a magnitude of 3.2 A at the high voltage could be detectable) resulting in low efficiency (0.64%), which inevitably lowers the accuracy of high-voltage power line path detection.

The high-voltage power line path exploration apparatus 10 of the present disclosure may include a reverse current limiter consisting of one or more ferrite cores wrapping over the external conductor (concentric neutral) of the power line to be traced to limit the multiple paths effect of returning current in which inherently the returning current signal will be divided into the 3 separate jointed external conductors respectively, so as to reduce the loss of the exploration signal (i.e., the current pulse signal flowing in the forward direction). Accordingly, the reverse current pulse signal returned thru the external conductor of the high voltage line to be traced to be minimized, so that the electromagnetic field signal generated by the forward current pulse signal can be detected by the desired power line among the multiple configured neutral wires with minimum loss, thereby improving the accuracy of the exploration.

Figure 22:
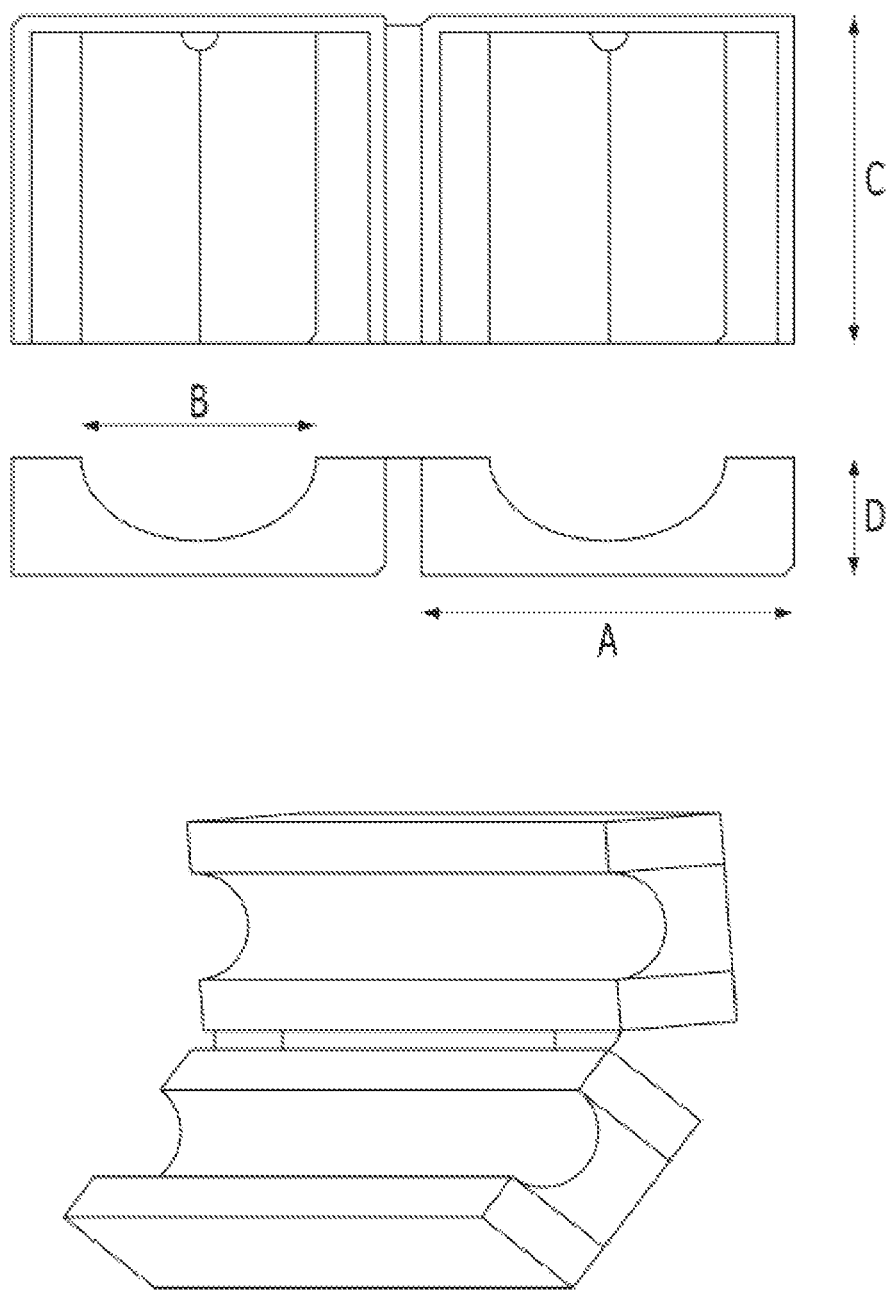
FIG. 22 illustrates a form of a ferrite core separated from a reverse voltage current limiter.

Specifically, the ferrite core used in the reverse current limiter limits the conductive emitted noise such as the pulse current flowing in the external conductor, thereby ultimately removing the radiant emission interference toward directly emitted around the high voltage power line by the forward polarity pulse current flows. That is, the ferrite core blocks signals with instantaneously changing high frequency components, such as current pulse signals, while it may not affect low frequency voltage signals, such as normal power frequencies. Moreover, the larger current could be blocked if more numbers of the ferrite core installed. And it does not affect the low frequency current flows even increased numbers of cores. The ferrite core has two U-shaped shapes as shown in FIG. 22, and can be separated, so that an unnecessary reverse current can be limited by surroundings without cutting an external conductor in the field.

Figure 23:
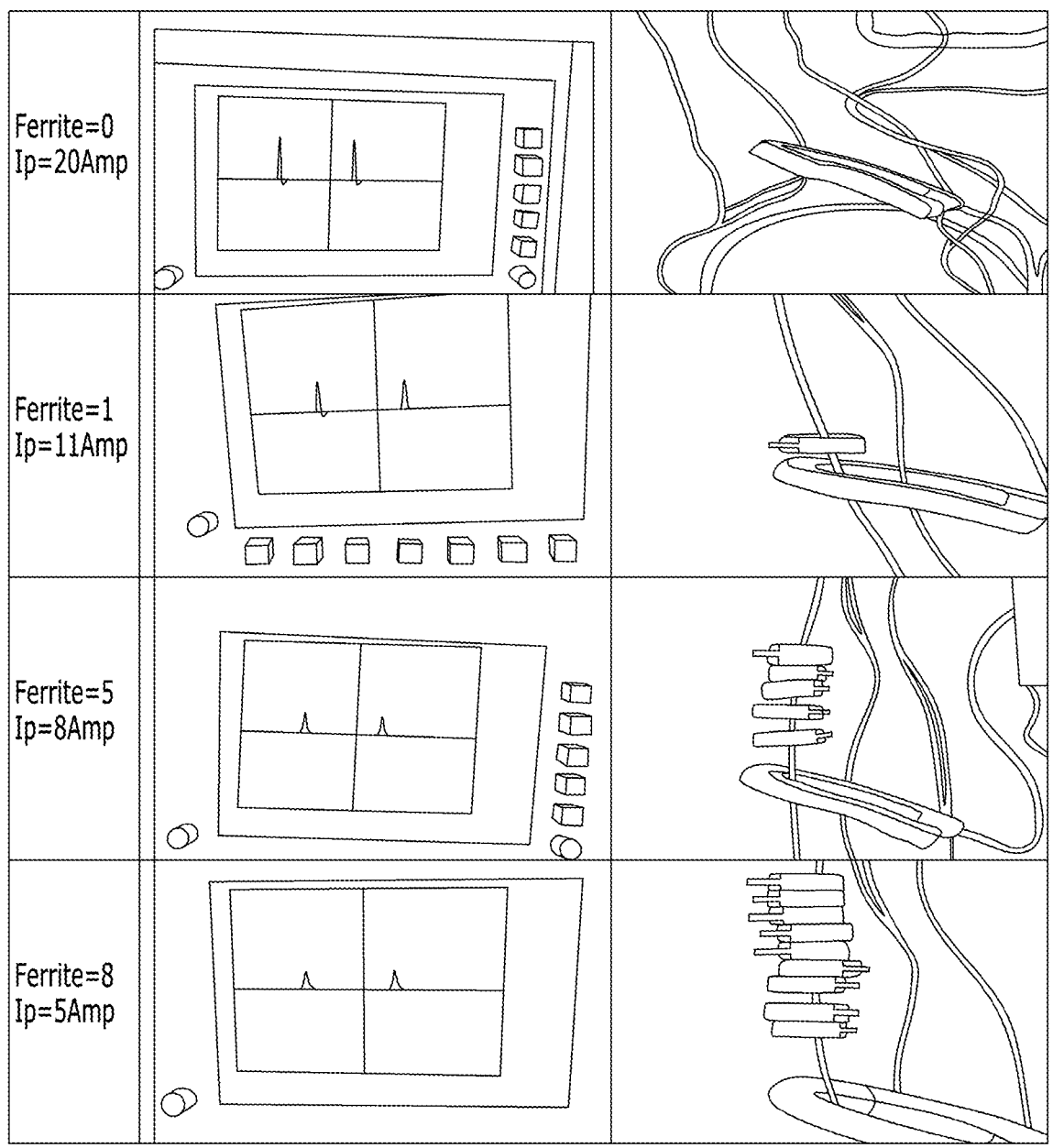
FIG. 23 shows the result of the reverse voltage limiter measuring the change in magnitude of the reverse feedback current pulse signal according to the change in the number of ferrite cores.

FIG. 23 illustrates a result of measuring a change in the magnitude of the current pulse signal returned in the reverse direction according to the numbers provided by the ferrite core(s). If a ferrite core is not provided, as shown in FIG. 23, a reverse current can flow through 20 A. In comparison, when one ferrite core is provided in the outer conductor, it can be seen that about 50% of the reduced 11 A flows, and when five are installed, it can be seen that a reduced 8 A flows to 60%, and when eight are installed, a 5 A reduced by 75% flows. That is, as the number of the ferrite cores increases, the magnitude of the current pulse signal returned in the reverse direction decreases.

Figure 24:
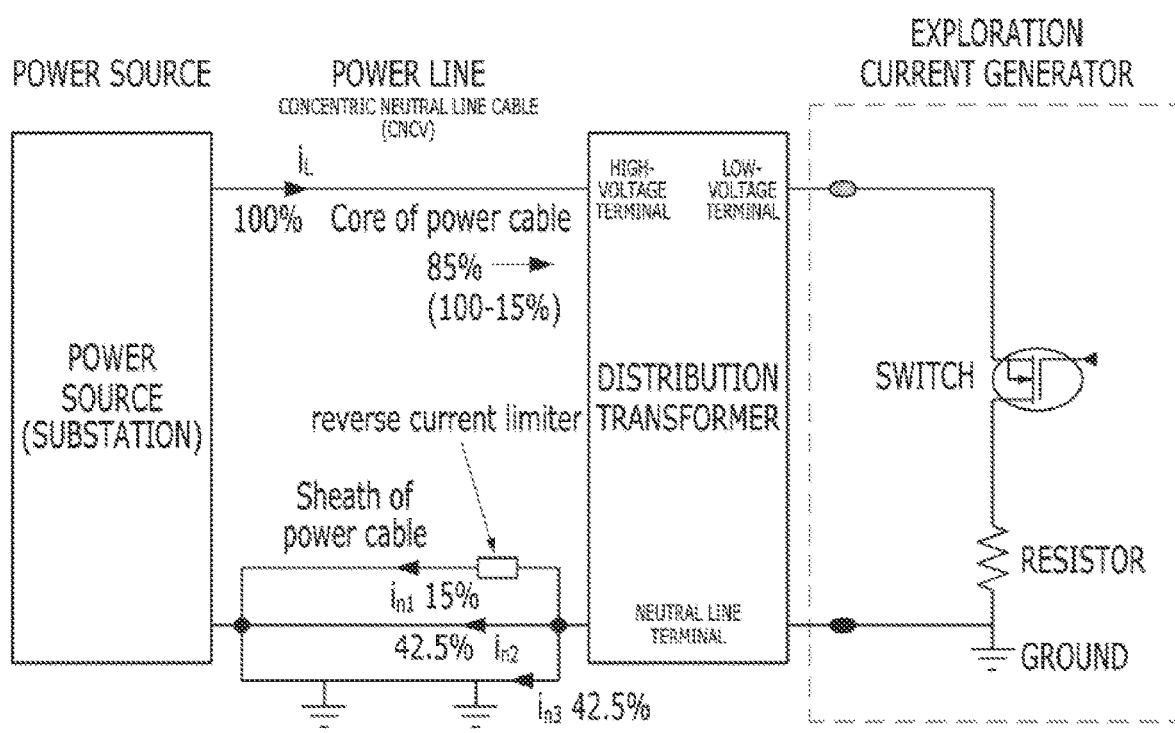
FIG. 24 is a diagram for explaining a method of improving the sensing sensitivity by installing a reverse current limiter on a high-voltage power line to be explored and one high-voltage power line nearby to minimize the magnitude of a reverse feedback current pulse signal in the vicinity of the power cable to be explored.

FIG. 24 illustrates a method for enhancing a sense of exploration signal by minimizing the magnitude of a reverse feedback current pulse signal in an exploration target power cable thereof by installing the ferrite core(s) over the high-voltage power line.

For example, as illustrated in FIG. 24, when the current pulse signal flowing through the high-voltage power line accounts a magnitude of 100 while the magnitude of the signal of the current pulse returned to the external conductor has a magnitude of 60 (or 60%), eight ferrite cores can be provided to lower the magnitude of the signal of the returning current pulse by 75% (i.e., 60−45=15). In this case, a signal of a current pulse having a magnitude of 45, which corresponds to 75% of a signal of a current pulse having a magnitude of 60, is cut off, so that only a current pulse signal having a magnitude of 15 flows into the return current so that a path of the high voltage power line can be detected by an electromagnetic field signal with a magnitude of 85 radiated in response to the magnitude of current pulse signal flows.

As a more specific example, when the exploration current generation module connected to the low-voltage terminal of the transformer generates the current pulse signal of 500 A, the current pulse signal may be transformed into the current pulse signal attenuated by 1/60 corresponding to the inverse ratio of winding turns (1/60) and flow on the high-voltage power line. As described above, since three lines of the external conductor are commonly connected and grounded, 60% may be fed back to the external conductor of the power line to be traced and 20 may be fed back to each of the external conductors of other power lines of remaining phases. That is, 3.2 A equivalent electromagnetic signal which is 40% of 8 A may flow on the high-voltage power line to be searched. In this case, when eight ferrite cores are provided on the external conductor (sheath) which is connected to the high-voltage power line to be traced, 75% of the current of 60% fed back in the reverse direction may be blocked. That is, 75% (i.e., 3.6 A) of 4.8 A corresponding to the current of 60% of 8 A is limited by the ferrite core, and as a result, a current which is fed back in the reverse direction may become 1.2 A. As a result, when the ferrite core is provided in the external conductor of the power cable, the magnitude of 6.8 A equivalent electromagnetic signal may be detected around the high-voltage power line as the current pulse signal flows for exploration.

That is, before the ferrite core is provided in the external conductor, the current pulse signal having the magnitude of 3.2 A flows on the high-voltage power line and efficiency is just 0.64%, but after the reverse current limiter having one or more ferrite cores are installed, the forward current pulse signal having a maximum magnitude of 6.8 A may flow and the efficiency is '1.28%' and signal detection efficiency of twice or more increases, thereby enhancing the exploration accuracy of the high-voltage power line twice or more.

That is, the ferrite core(s) is(are) provided in the external conductor of the high-voltage power line to be explored, and as a result, the current pulse signal may flow in a desired direction, thereby preventing a cancellation phenomenon with the current pulse signal which is fed back in the reverse direction. As a result, detection efficiency of a signal for exploring the path of the high-voltage power line may be enhanced and the current pulse signal may be controlled to flow through the neutral line in a required direction among various paths, thereby enabling exploration a spare power line without a switching operation to load transfer.

Figure 25:
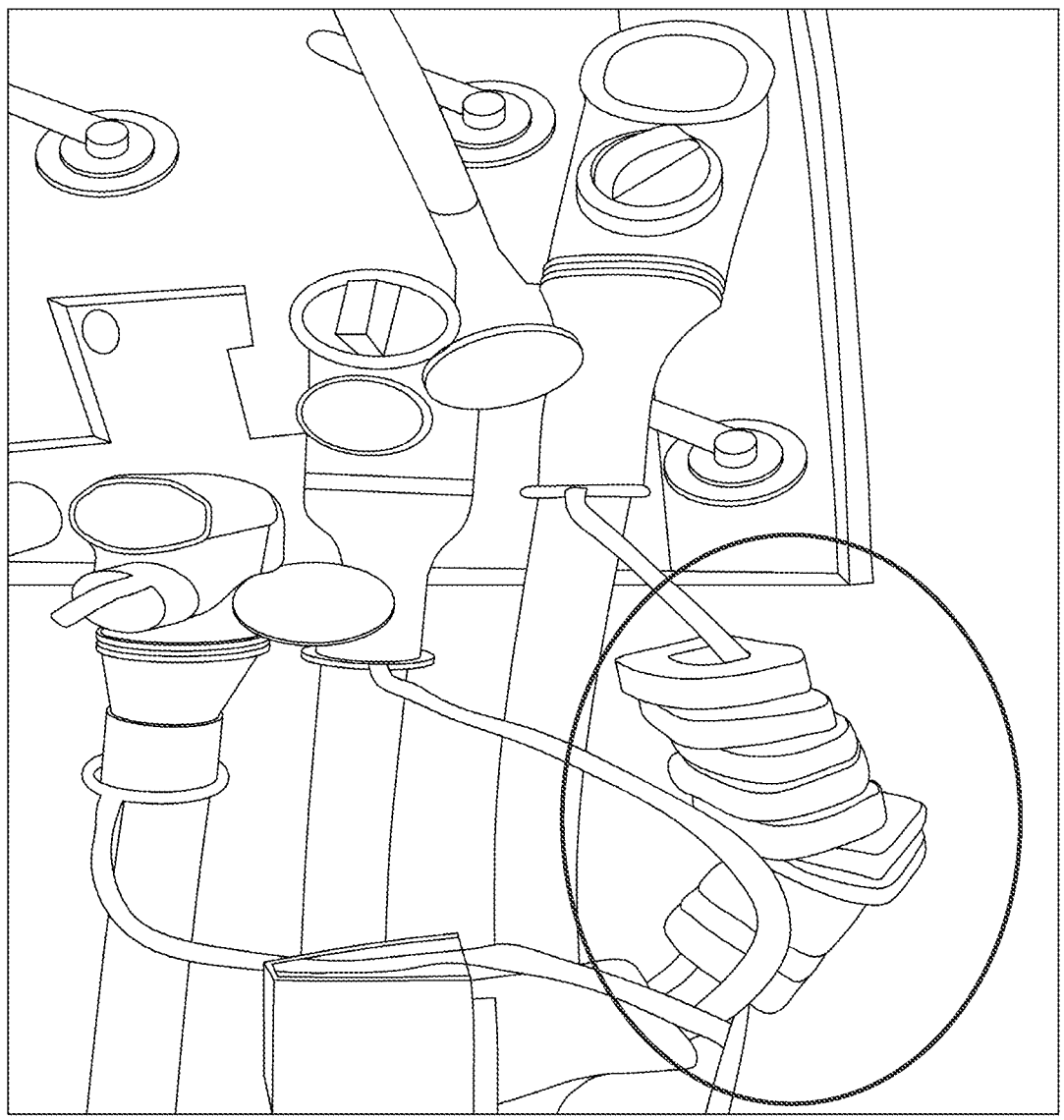
FIG. 25 is a diagram for describing a decrease in loss of a current pulse signal when a feedback current for an exploration target external conductor is limited according to an exemplary embodiment of the present disclosure.

FIG. 25 illustrates a state in which multiple ferrite coils are installed in the external conductor of the high-voltage cable to be explored.

Figure 26:
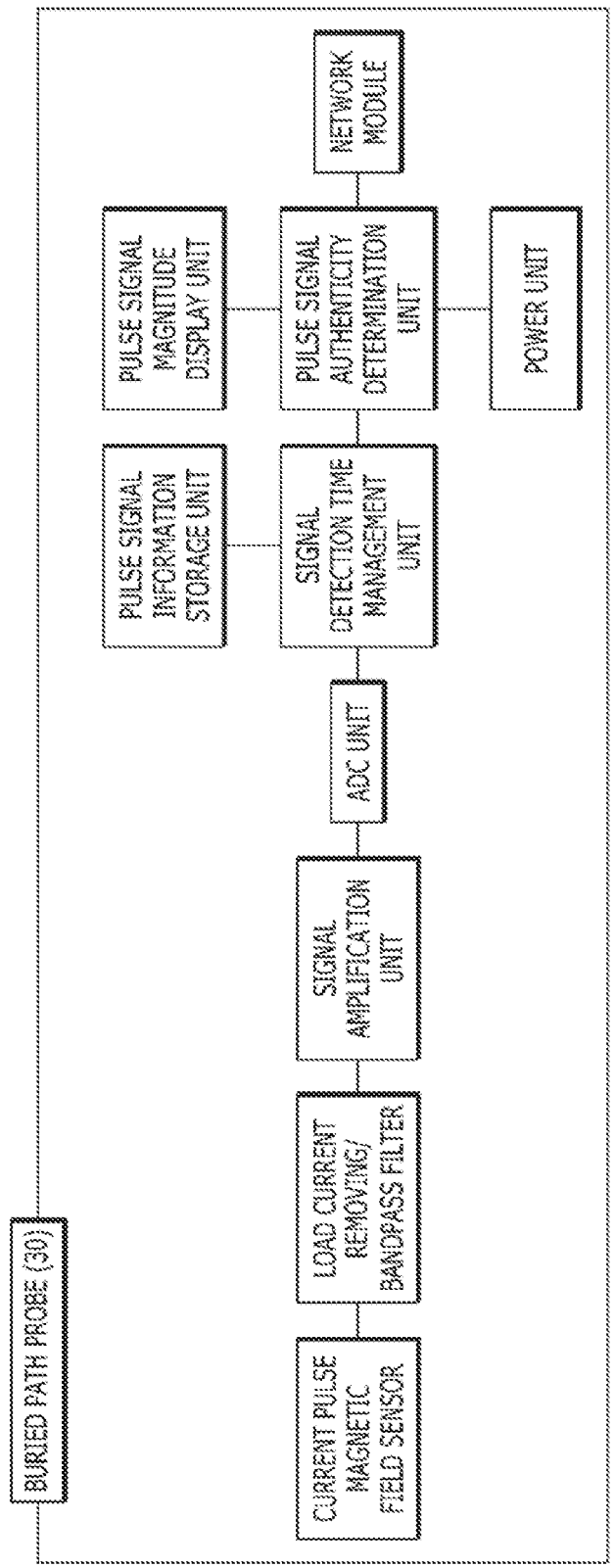
FIG. 26 illustrates a state in which an actual ferrite core is installed in an external conductor of an exploration target high-voltage power line according to an exemplary embodiment of the present disclosure.

FIG. 26 illustrates a structure of a buried path exploration apparatus.

A current pulse magnetic field sensor as an antenna form winding a rod-shaped balun with a coil winding receives a pulse type magnetic field signal emitted from a high-voltage power line.

A bandpass filter blocks a magnetic field signal generated by a power frequency load current occupying a large part of the magnetic field signal and a high-frequency band to maximally filter only the magnetic field signal generated by the pulse current signal generated by the exploration signal generator.

A signal amplification unit amplifies an analog signal passing through the bandpass filter.

An ADC converts the analog signal into a digital signal.

A signal detection time management unit may filter and pass only a signal input for a corresponding time and a corresponding period according to pulse signal generation time and period information provided by a pulse signal information storage unit.

The pulse signal information storage unit keeps signal features such as a generation time and a holding time, and a period of the current pulse signal and provides the kept signal features to the signal detection time management unit.

A pulse signal authenticity determination unit determines the authenticity by analyzing a code value of a signal passing through the signal detection time management unit.

A pulse signal amplitude display unit displays a magnitude and a polarity of a pulse signal that has passed the authenticity determination by the pulse signal authenticity determination unit.

A network module may perform a function to receive signal generation information in connection to an exploration signal generator.

Figure 27:
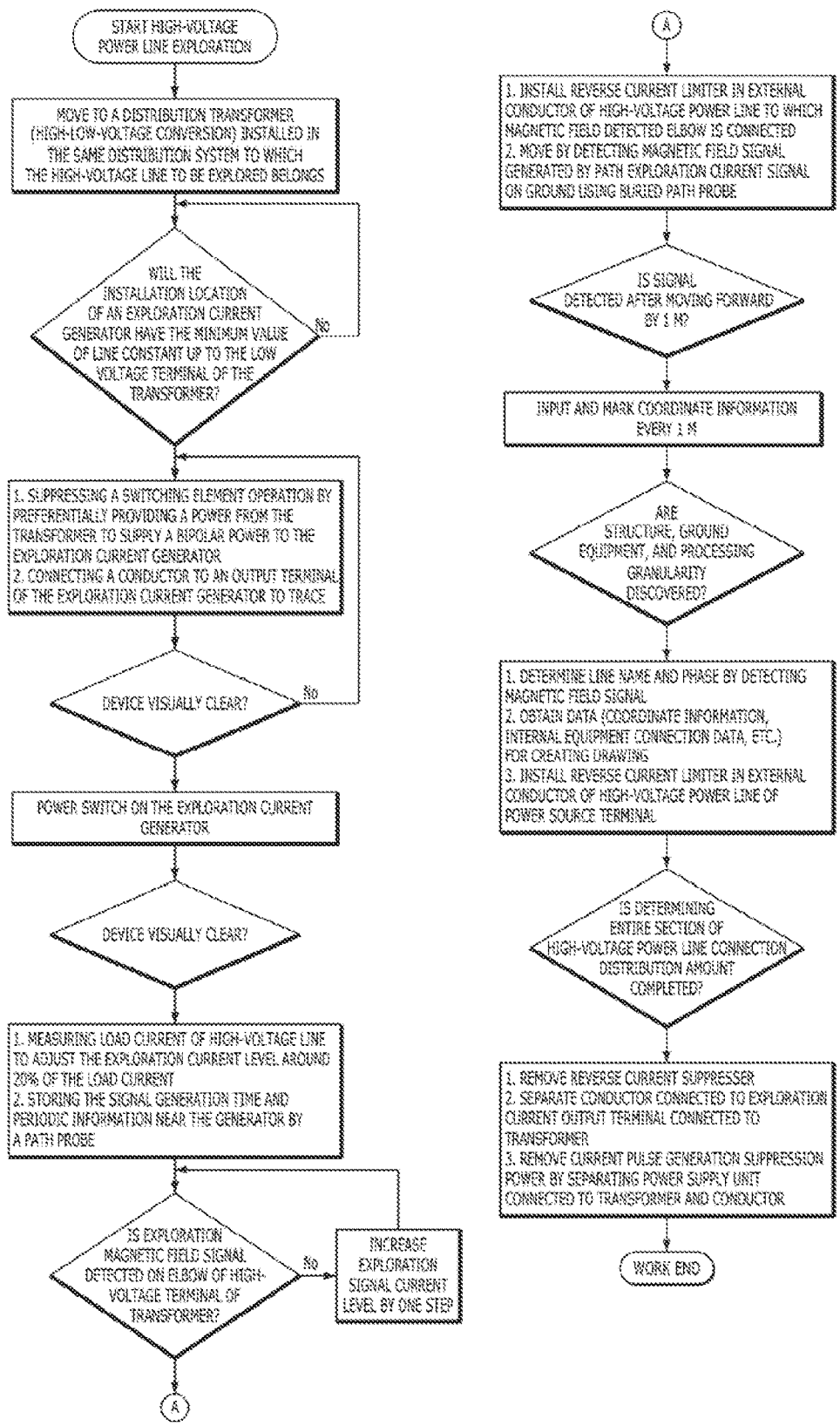
FIG. 27 is an order flowchart exemplarily illustrating an operation step for exploring a high-voltage power line path according to an exemplary embodiment of the present disclosure.

FIG. 27 is a flowchart exemplarily illustrating an order for exploring a high-voltage power line path according to an exemplary embodiment of the present disclosure.

According to an exemplary embodiment of the present disclosure, a method for exploring a path of a high-voltage power line may be performed through the following steps:

Setting a location of the distribution transformer 12 in the same distribution network as the high-voltage power line 13 to be explored;

setting a place adjacent to a secondary low-voltage terminal of the distribution transformer 12 and capable of minimizing an influence of a line constant by connecting an exploration current generator 20;

further, taking a measure of suppressing a switching element operation by preferentially receiving a power of the distribution transformer and supplying a bipolar power of the exploration current generator 20;

connecting an exploration current pulse signal output terminal to a power source of the distribution transformer 12 after the operation suppressing operation;

generating a current pulse signal having an appropriate size by measuring a load current;

synchronizing and storing signal generation time and period information with a buried path probe 30;

installing a reverse current limiter in an external conductor of an exploration target high-voltage power line 13;

exploring a buried path while moving;

distinguishing a line and a phase of a high voltage line installed wherein a ground or underground mounted equipment, a underground structure such as a utility hole, and a vault riser;

determining the path of the high-voltage power line up to a target power source by determining and moving the buried path of the high-voltage power line according to the magnetic field signal and repeating an operation of identifying the corresponding high-voltage power line at a place accessible to the high-voltage power line; and when the determination is completed, completing work by marking a determined result on a site and creating a drawing.

The steps of FIG. 27 described above may be changed in order as necessary, and at least one or more steps may be omitted or added. Further, the aforementioned step is just an exemplary embodiment of the present disclosure and the scope of the present disclosure is not limited thereto.

As described above, the high-voltage power line path exploration apparatus of the present disclosure transmits a current pulse in a predetermined signal standard and detects the magnetic field signal generated in response to the current pulse signal on the high-voltage power line to determine a path and connectivity, while in live line operation of power equipment in the same power distribution network without using an additional line.

Accordingly, the present invention can check the circuits before work by grasping the connectivity and path of the high-voltage power line, thereby preventing safety accidents and efficiently managing facilities. Also, the present invention can prevent a safety accident and a power failure due to a mis-operation (human error) of power equipment and a design error of construction plan by grasping a history of a high-voltage power line connected to a power device to check and operate a line to be conducted before a new construction or repair work of a low or high voltage power line is performed, by enabling a user to grasp a configuration history and a path of a high-voltage line operated in a live line.

What is claimed is:

1. A stability-improved high voltage power line exploration apparatus for tracking a high voltage power line that supplies voltage and current by being connected to a primary winding of a distribution transformer that converts high voltage for distribution into low voltage in proportion to the ratio of the winding combinations to determine a buried path and a connection configuration of a distribution system network, the apparatus comprising;
   an exploration current generator connected to a secondary winding of the distribution transformer and generating a current pulse signal inversely proportional to a winding ratio so as to detect an electromagnetic field signal around the high voltage power line,
   a buried path probe for determining the buried path and connection configuration of the high voltage power line by detecting the electromagnetic field signal which is generated around the high voltage power line when the current pulse signal flows through the high voltage power line; and
   a reverse current limiter for suppressing a generation of a reverse electromagnetic field generated by an external conductor of the high voltage power line, to improve a reception performance of the buried path probe.

2. The stability-improved high voltage power line exploration apparatus of claim 1, wherein the exploration current generator comprising:
   a switching unit for generating a current pulse signal by interrupting a current flowing through an electric load and a diode, wherein the electric load and the diode are in series connection with a first conductor to be explored among one or more conductors, which are connected to both ends of a secondary winding of the distribution transformer;
   a power supply unit for supplying an operating power of the exploration current generator, wherein the power supply unit is connected to one of the one or more conductors except for the first conductor;
   a current pulse generation time control unit for controlling an operation of the switching unit;
   a current pulse generation time calculation unit for controlling an operation time of the switching unit;
   a voltage measuring unit for measuring a voltage at both ends of the switching unit;
   a current measuring unit for measuring a current flown by an operation of the switching unit; and
   a temperature measuring unit for sensing a surface temperature of the switching unit.

3. The stability improved high voltage power line exploration apparatus of claim 1, wherein the buried path probe comprising:
   a magnetic field sensor, which is positioned perpendicular to the buried direction of the high voltage power line, for receiving a magnetic field signal corresponding to a generation time of the current pulse signal generated from the exploration current generator;
   a band filter for removing a load current and an out-of-band signal by band filtering the magnetic field signal received by the magnetic field sensor;
   a signal amplifying unit for amplifying a signal passing through the band filter;
   an ADC for converting an analog signal that has passed through the signal amplifying unit to a digital signal;
   a signal detection time management unit for detecting a signal corresponding to a pulse signal generation time from the digital signal converted by the ADC;
   a pulse signal information storage unit for providing a generation time and period information of a pulse signal stored in the signal detection time management unit to the signal detection time management unit;
   a pulse signal determination unit for determining whether a signal passed through the signal detection time management unit is genuine; and
   a pulse signal magnitude display unit for displaying pulse signal information passing through the pulse signal determination unit.

4. The stability-improved high voltage power line exploration apparatus of claim 1, wherein the reverse current limiter can be installed without separating an outer conductor of the high voltage power line by having a combination structure of one or more cylindrical detachable ferrite core, wherein the ferrite core generates resistance by resonating at a specific frequency of a pulse current in order to ultimately minimize an impact of a signal emitted by a forward pulse current by controlling conducted emission noise flowing through an external conductor of the high voltage power line.

5. The stability-improved high voltage power line exploration apparatus of claim 1, further comprising:
   a network module for transmitting and receiving signal information of a current pulse signal generated from the exploration current generator and signal information of a current pulse signal based on a magnetic field signal measured from the buried path probe, by connecting communication between the exploration current generator and the buried path probe.

6. The stability-improved high voltage power line exploration apparatus of claim 2, wherein the exploration current generator further comprising:
   a voltage rise limiting unit for controlling the voltage rise when the switching unit operates, wherein the voltage rise limiting unit is configured as a combination of a snubber, a voltage limiter, and inductor chokes.

7. The stability-improved high voltage power line exploration apparatus of claim 3, wherein the buried path probe stores a pulse signal generation time and period information in the pulse signal information storage unit without using a network module, by receiving a magnetic field signal through the magnetic field sensor near the exploration current generator.

8. A method for exploring a high voltage power line with improved stability, the method comprising:
   generating a current pulse signal inversely proportional to a winding ratio so as to detect an electromagnetic field signal around the high voltage power line through an exploration current generator connected to a secondary winding of a distribution transformer; and
   determining a buried path and connection configuration of the high voltage power line through a buried path probe that detects the electromagnetic field signal generated corresponding to a current pulse signal generated by the exploration current generator;

and wherein the generating a current pulse signal inversely proportional to a winding ratio so as to detect an electromagnetic field signal around the high voltage power line through an exploration current generator connected to a secondary winding of a distribution transformer comprises:

controlling a pulse generation operation of the switching unit by supplying a bipolar voltage before generating the current pulse signal.

\* \* \* \* \*